United States Patent
Shikatani et al.

[11] Patent Number: 5,436,485
[45] Date of Patent: Jul. 25, 1995

[54] TRANSISTOR ARRANGEMENT FOR FORMING BASIC CELL OF MASTER-SLICE TYPE SEMICONDUCTOR INTEGRATED CIRCUIT DEVICE AND MASTER-SLICE TYPE SEMICONDUCTOR INTEGRATED CIRCUIT DEVICE

[75] Inventors: Junichi Shikatani; Tetsu Tanizawa; Mitsugu Naito, all of Kawasaki, Japan

[73] Assignee: Fujitsu Limited, Kanagawa, Japan

[21] Appl. No.: 365,173

[22] Filed: Dec. 28, 1994

Related U.S. Application Data

[63] Continuation of Ser. No. 911,733, Jul. 10, 1992, abandoned.

Foreign Application Priority Data

Jul. 18, 1991 [JP] Japan .................. 3-178121

[51] Int. Cl.⁶ .................. H01L 27/02; H01L 27/10
[52] U.S. Cl. .................. 257/368; 257/204; 257/207; 257/401; 257/909
[58] Field of Search .................. 257/368, 204, 206, 207, 257/210, 401, 775, 909

[56] References Cited

FOREIGN PATENT DOCUMENTS

| | | |
|---|---|---|
| 0182121 | 5/1986 | European Pat. Off. . |
| 0393620 | 10/1990 | European Pat. Off. . |
| 57-100746 | 6/1982 | Japan . |
| 59-44843 | 6/1984 | Japan . |
| 59-163837 | 9/1984 | Japan . |
| 61-035535 | 2/1986 | Japan . |
| 63-311740 | 12/1988 | Japan . |
| 23279 | 1/1990 | Japan . |

OTHER PUBLICATIONS

The Proceedings of the 1st International Conference on Semi-Custom IC's Nov. 1981, London GB; pp. 65-74.

*Primary Examiner*—Mark V. Prenty
*Attorney, Agent, or Firm*—Armstrong, Westerman, Hattori, McLeland & Naughton

[57] ABSTRACT

A master-slice type semiconductor integrated circuit device includes a first transistor, and a second transistor. The first and second transistors are arranged side by side in a first direction. The first and second transistors respectively have first and second gate electrodes extending in a second direction perpendicular to the first direction. The first gate electrode has a first portion in which two gate contacts arranged in the first direction can be made. The second gate electrode has a second portion in which two gate contacts arranged in the first direction can be made.

32 Claims, 38 Drawing Sheets

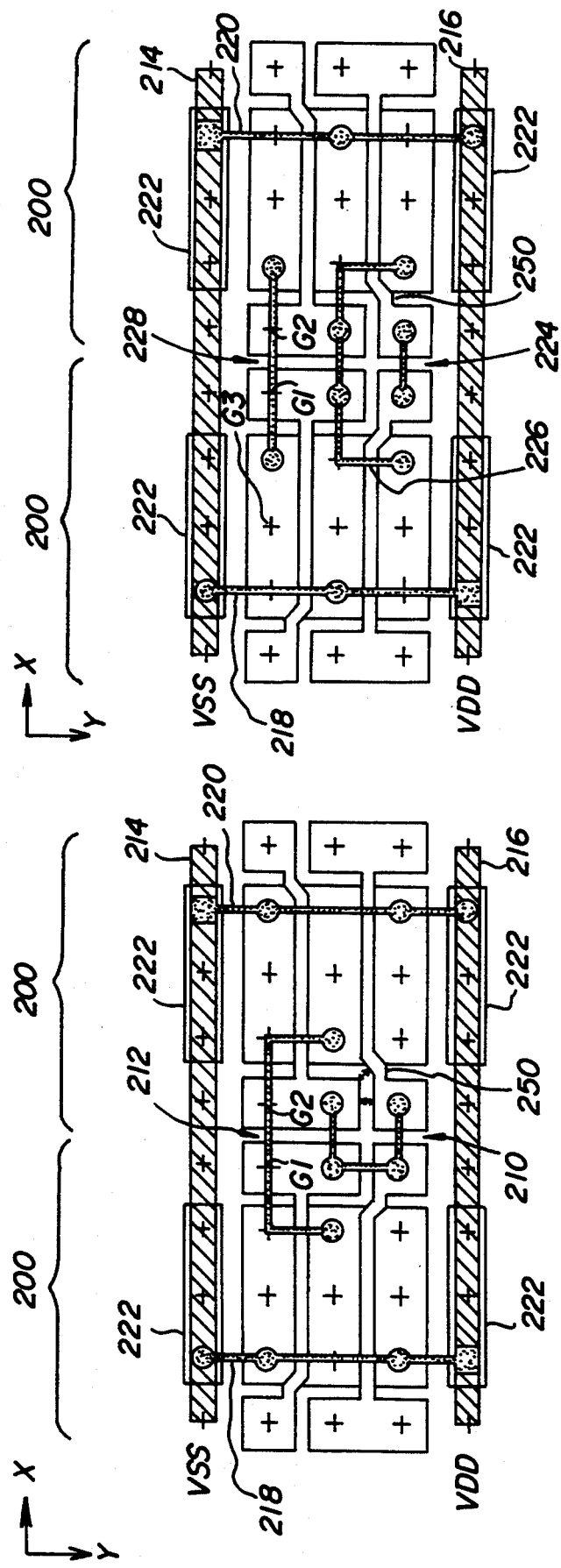

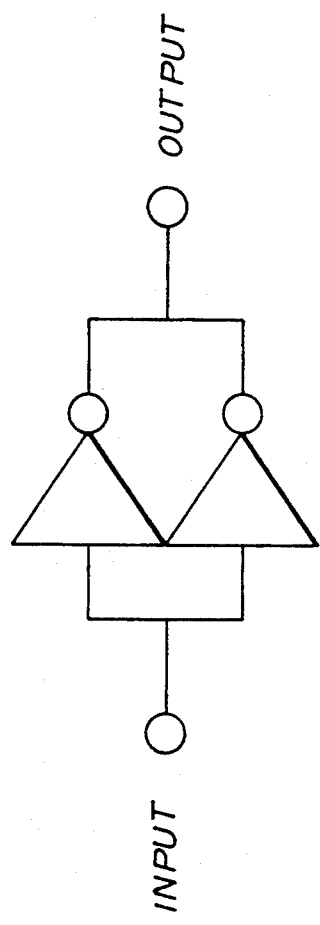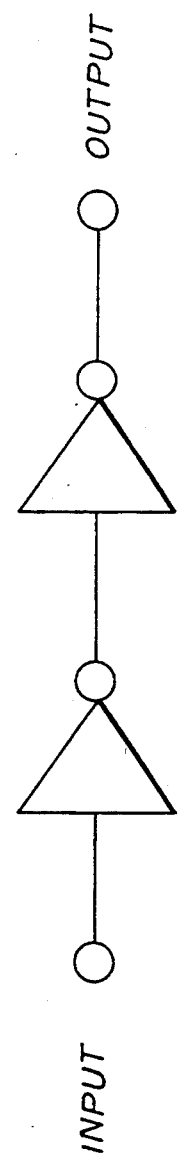

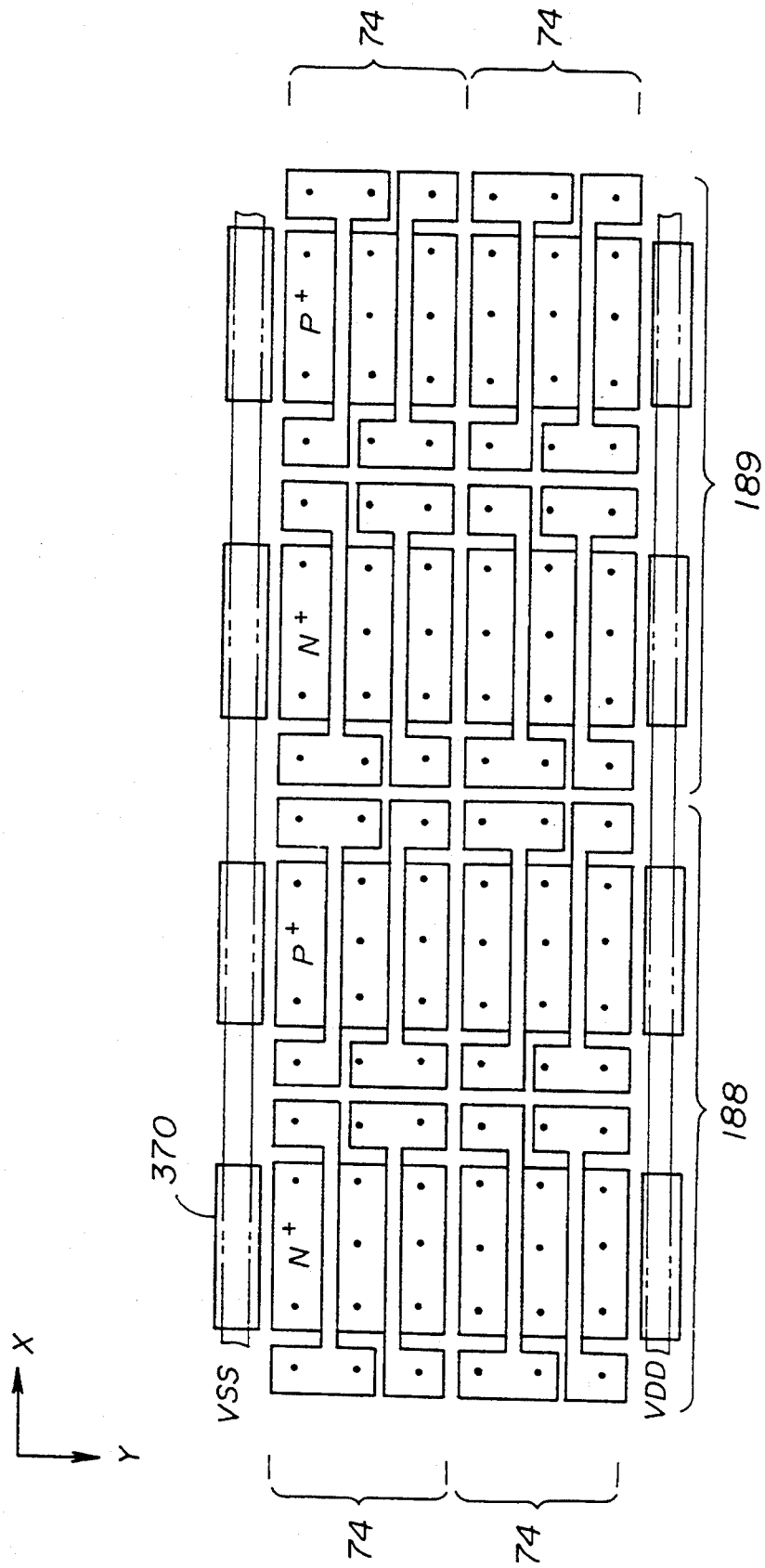

TRANSISTOR ARRANGEMENT FOR FORMING BASIC CELL OF MASTER-SLICE TYPE SEMICONDUCTOR INTEGRATED CIRCUIT DEVICE AND MASTER-SLICE TYPE SEMICONDUCTOR INTEGRATED CIRCUIT DEVICE

This application is a continuation of application Ser. No. 07/911,733 filed Jul. 10, 1992, now abandoned.

BACKGROUND OF THE INVENTION

1. Field of the Invention

The present invention generally relates to semiconductor integrated circuit devices, and more particularly to semiconductor integrated circuit devices in which basic cells are regularly arranged, such as master-slice type semiconductor integrated circuit devices (gate arrays), and hybrid LSI circuit devices in which basic cells are formed on a chip together with standard cells, CPU cores and analog circuits.

For example, a master-slice type semiconductor integrated circuit device comprises basic cells arranged on a chip center area surrounded by chip peripheral areas. In the past, the basic cells were arranged in a wiring channel manner in which basic cell arrangement areas and wiring channel areas on the chip are separated from one another on the chip center area. Recently, in order to obtain an increased number of gates, there has been considerable activity in the development of master-slice type semiconductor integrated circuit devices of an SOG (Sea-Of-Gates) type. In the SOG type, a plurality of gate cells are arranged on the entire chip center area. In the master-slice type semiconductor integrated circuit devices, it is required that large-scale macrocells such as a RAM and a ROM, be arranged together with logic unit cells, such as inverters and NAND circuits. In this regard, it is desirable that the basic cells of the master-slice type semiconductor integrated circuit devices have a structure which makes it possible to efficiently arrange the logic unit cells and macrocells.

FIG. 1 shows a conventional basic cell for the master-slice type semiconductor integrated circuit devices. The basic cell shown in FIG. 1 comprises N+-type diffused regions 1–3, P+-type diffused regions, and gate electrodes made of polysilicon. An n-type MOS transistor (hereinafter simply referred to as an nMOS transistor) 11 is formed by the N+-type diffused regions 1 and 2, and the gate electrode 7. An nMOS transistor 12 is formed by the N+-type diffused regions 2 and 3 and the gate electrode 8. A p-type MOS transistor (hereinafter simply referred to as a pMOS transistor) 13 is formed by the P+-type diffused regions 4 and 5, and the gate electrode 9, and a pMOS transistor 14 is formed by the P+-type diffused regions 5 and 6, and the gate electrode 10.

FIG. 2 shows another conventional basic cell for the master-slice type semiconductor integrated circuit devices (see U.S. Pat. No. 5,053,993). The basic cell shown in FIG. 2 comprises N+-type diffused regions 15–23, P+-type diffused regions 24–26, and gate electrodes 27–30 made of polysilicon. An nMOS transistor 31 is formed by the N+-type diffused regions 15 and 16, and the gate electrode 27, and an nMOS transistor 32 is formed by the N+-type diffused regions 16 and 17, and the gate electrode 28. A pMOS transistor 33 is formed by the P+-type diffused regions 24 and 25, and the gate electrode 27, and a pMOS transistor 34 is formed by the P+-type diffused regions 25 and 26 and the gate electrode.

An nMOS transistor 35 is formed by the N+-type diffused regions 18 and 19, and the gate electrode 29, and an nMOS transistor 36 is formed by the N+-type diffused regions 19 and 20 and the gate electrode 30. An nMOS transistor 37 is formed by the N+-type diffused regions 21 and 22, and the gate electrode 29, and an nMOS transistor 38 is formed by the N+-type diffused regions 22 and 23, and the gate electrode 30.

The basic cell shown in FIG. 2 is suitable for a two-port RAM. In this case, the nMOS transistors 31 and 32 and the pMOS transistors 33 and 34 form two inverters functioning as a memory cell, and the four nMOS transistors 35–38 form respective transfer gates for selectively connecting the memory cell to two pairs of bit lines. Generally, the nMOS transistors 35–38 have sizes smaller than those of the transistors 31–34 in order to prevent an erroneous read/write operation.

However, the conventional basic cell shown in FIG. 1 has disadvantages which will be described in detail later. The conventional basic cell shown in FIG. 2 has the following disadvantages. The basic cell shown in FIG. 2 is long in the longitudinal or traverse direction because of the presence of the nMOS transistors 35–38. Hence, the layout of wiring layers needs a large wiring pitch between adjacent wiring layers (channels), and has a small degree of freedom regarding the allocation of the logic unit cells and the formation of the wiring channel areas. Further, if a single-port RAM is formed using the basic cells as shown in FIG. 2, the basic cells cannot be efficiently used because some transistors are not used for forming the single-port RAM. The above-mentioned disadvantages hold true for hybrid LSIs having the basic cells, the standard cells, the CPU cores and analog circuits.

SUMMARY OF THE INVENTION

It is a general object of the present invention to provide a master-slice type semiconductor integrated circuit device, in which the above disadvantages are eliminated.

A more specific object of the present invention is to provide a master-slice type semiconductor integrated circuit device having a transistor arrangement capable of providing an increased degree of freedom regarding the allocation of logic cell units and selection of wiring channel areas and efficiently using basic cells to form logic unit cells, RAM cells and/or ROM cells, and which has reduced channel widths of transistors in the basic cell areas and hence an increased integration density.

The above objects of the present invention are achieved by a master-slice type semiconductor integrated circuit device comprising a first transistor, and a second transistor, the first and second transistors being arranged side by side in a first direction. The first and second transistors respectively have first and second gate electrodes extending in a second direction perpendicular to the first direction. The first gate electrode has a first portion in which two gate contacts arranged in the first direction can be made. The second gate electrode has a second portion in which two gate contacts arranged in the first direction can be made.

The above-mentioned objects of the present invention are also achieved by a master-slice type semiconductor integrated circuit device comprising a first transistor arrangement, and a second transistor arrangement, the first and second transistor arrangements having first and second conductivities. Each of the first and second transistor arrangements comprises a first transistor, and a second transistor. The first and second transistors are arranged side by side in a first direction. The first and second transistors respectively have first and second gate electrodes extending in a second direction perpendicular to the first direction. The first and second transistor arrangements are arranged side by side in the second direction. The first gate electrode has a first portion in which two gate contacts arranged in the first direction can be made. The second gate electrode has a second portion in which two gate contacts arranged in the first direction can be made.

BRIEF DESCRIPTION OF THE DRAWINGS

Other objects, features and advantages of the present invention will become more apparent from the following detailed description when read in conjunction with the accompanying drawings, in which:

FIGS. 4A and 4B are respectively diagrams showing advantages obtained when a plurality of transistor arrangements as shown in FIG. 3 are used;

FIG. 6A is a block diagram of a logic circuit realized by the structure shown in FIG. 4A or FIG. 5A;

FIG. 6B is a block diagram of another logic circuit realized by the structure shown in FIG. 4B or FIG. 5B;

FIGS. 34A, 34B, 34C and FIG. 34D are plan views of a sixth embodiment of the present invention and its variations;

DESCRIPTION OF THE PREFERRED EMBODIMENTS

Figure 3:
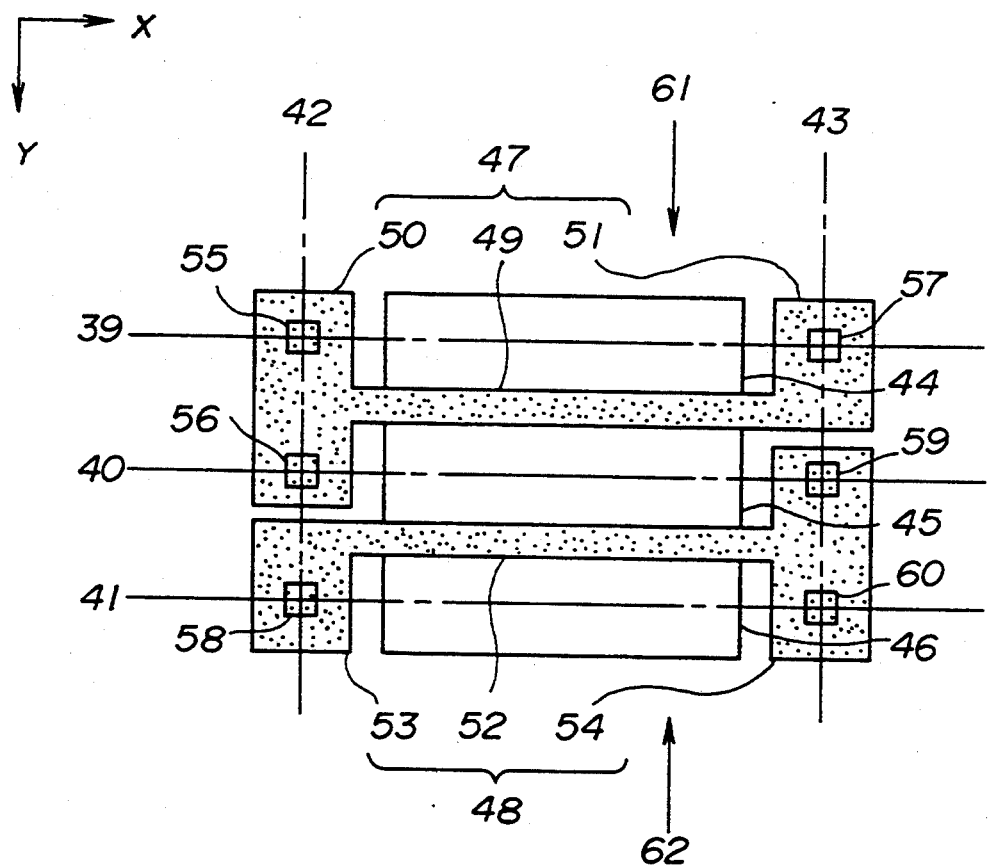
FIG. 3 is a plan view showing a MOS transistor arrangement of the present invention.

FIG. 3 is a plan view showing a MOS transistor arrangement for forming a basic cell of a semiconductor integrated circuit device according to the present invention. Lines 39, 40 and 41 denote wiring channels, which extend in the X direction and have at intervals (wiring pitches) defined in the Y direction orthogonal to the X direction. Lines 42 and 43 denote wiring channels, which extend in the Y direction and have intervals (wiring pitches) defined in the Y direction. The transistor arrangement shown in FIG. 3 comprises impurity diffused regions 44–46, which serve as sources or drains. The diffused regions 44–46 are formed in a semiconductor substrate and arranged side by side in the Y direction. The wiring channels 39, 40 and 41 extend above the diffused regions 44, 45 and 46, respectively.

Gate electrodes 47 and 48 are formed as shown in FIG. 3. The gate electrode 47 has a narrow portion 49, a first wide portion 50 and a second wide portion 51. Similarly, the gate electrode 48 has a narrow portion 52, a first wide portion 53 and a second wide portion 54. The narrow portion 49 of the gate electrode 47 extends, in the X direction, above a substrate area (channel area) between the diffused region 44 and the diffused region 45, and connects the first and second wide portions 50 and 51 to each other. More specifically, the first wide portion 50 of the gate electrode 47 is connected to a left end of the narrow portion 49, and located outside respective left ends of the impurity diffused regions 44 and 45 in FIG. 3. The first wide portion 50 has gate contact areas 55 and 56 at cross points at which the wiring channel 42 crosses the wiring channels 39 and 40, respectively. The second wide portion 51 of the gate electrode 47 is connected to a right end of the narrow portion 49, and located outside a right end of the impurity diffused region 44. The second wide portion 51 has a gate area 57 located at a cross point at which the wiring channel 43 crosses the wiring channel 39.

The narrow portion 52 of the gate electrode 48 extends, in the X direction, above a substrate area (channel area) between the diffused region 45 and the diffused region 46, and connects the first and second wide portions 53 and 54 to each other. More specifically, the first wide portion 53 of the gate electrode 48 is connected to a left end of the narrow portion 52, and located outside a left end of the impurity diffused region 46 in FIG. 3. The first wide portion 53 has a single gate contact area 58 at a cross point at which the wiring channel 42 crosses the wiring channel 41. The second wide portion 54 of the gate electrode 48 is connected to a right end of the narrow portion 52, and located outside respective right ends of the impurity diffused regions 45 and 46. The second wide portion 51 has gate contact areas 58 and 59 located at cross points at which the wiring channel 43 crosses the wiring channels 40 and 41, respectively.

The diffused regions 44 and 45, and the gate electrode 47 form a MOS transistor 61. The diffused regions 45 and 46, and the gate electrode 48 form a MOS transistor 62. When the diffused regions 44, 45 and 46 are N+-type impurity diffused regions, the MOS transistors 61 and 62 are nMOS transistors. When the diffused regions 44, 45 and 46 are P+-type impurity diffused regions, the MOS transistors 61 and 62 are pMOS transistors.

It is very important that the gate electrode 47 has two gate contact areas 55 and 56 formed in the first wide portion 50 arranged in the Y direction, and the gate electrode 48 has two gate contact areas 59 and 60 formed in the second wide portion 54 and arranged in the Y direction.

Two transistor arrangements as shown in FIG. 3 are used for forming complementary MOS (CMOS) transistors. FIG. 4A shows a CMOS transistor area having two transistor arrangements 200, each having the structure shown in FIG. 3. The transistor arrangements 200 are disposed in reflection symmetry with each other in the Y direction. One of the transistor arrangements 200 is of the P type, and the other one thereof is of the N type. In FIG. 4A, symbol "+" denotes a grid used for reference in, for example, a CAD (Computer Aided Design) system. Each of the transistor arrangements 200 shown in FIG. 4A has five grids for each wiring channel extending in the X direction, and three grids for each wiring channel extending in the Y direction. Wiring lines are provided for the CMOS transistor area in order to form a logic circuit shown in FIG. 6A. The logic circuit shown in FIG. 6A comprises two CMOS inverters connected in parallel.

In FIG. 4A, each thick solid line denotes a wiring line formed at a first wiring-layer-level, and each hatched thick line denotes a wiring line formed at a second wiring-layer-level higher than the first wiring-layer-level. Symbol "▼" denotes a contact between the first-level wiring line and a bulk (semiconductor substrate in which the transistor arrangements 200 are formed). The symbol " " denotes a contact between the first-level wiring line and the second-level wiring line. A wiring line 210 is in contact with the four gate electrodes via four respective gate contacts thereof, and serves as an input terminal of the logic circuit shown in FIG. 6A. A wiring line 212 is in contact with the central diffused region of the left-hand transistor arrangement 200 via one of the three contacts thereof, and is in contact with the central diffused region of the right-hand transistor arrangement 200 via one of the three contacts thereof. The wiring line 212 serves as an output terminal of the logic circuit shown in FIG. 6A. A power supply line 214 having a potential VSS is formed at the second wring-layer-level and extends in the X direction. Similarly, a power supply line 216 having a potential VDD is formed at the second wiring-layer-level and extends in the X direction. Substrate contact layers 222 extend in the X direction. The potential VDD is higher than the potential VSS. Each of the substrate contact layers 222 has a length corresponding to three grids. The power supply line 214 is in contact with one of the substrate contact layers 222, and the power supply line 216 is in contact with another one of the substrate contact layers 222. A wiring line 218 extends in the Y direction and is in contact with the two diffused regions of the left-hand transistor arrangement 200 other than the central diffused region thereof. Further, the wiring line 218 is in contact with the substrate, and is in contact with the power supply line 216 at the second wiring-layer-level. A wiring line 220 extends in the Y direction and is in contact with the two diffused regions of the right-hand transistor arrangement 200 other than the central diffused region thereof. Further, the wiring line 220 is in contact with the power supply line 214 at the second wiring-layer-level, and the substrate.

Figure 1:
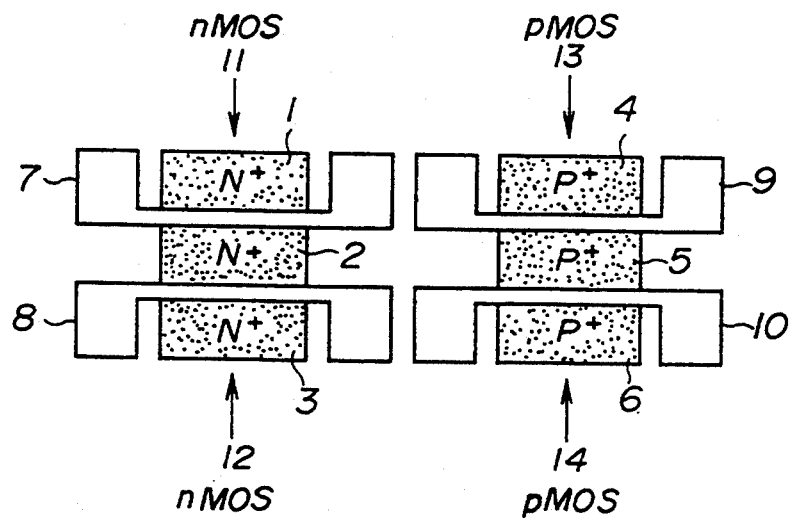
FIG. 1 is a plan view of a conventional basic cell.
Figure 2:
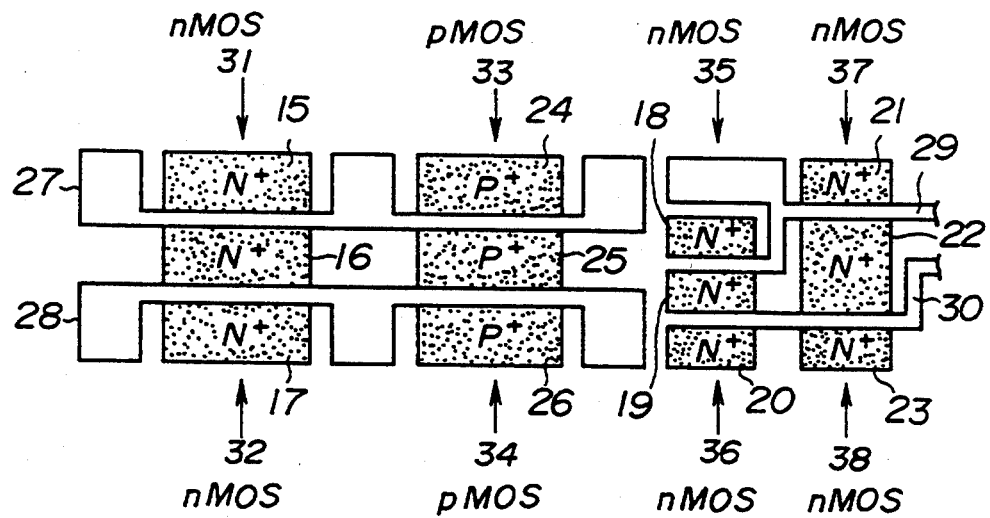
FIG. 2 is a plan view of another conventional basic cell.
Figure 5A:
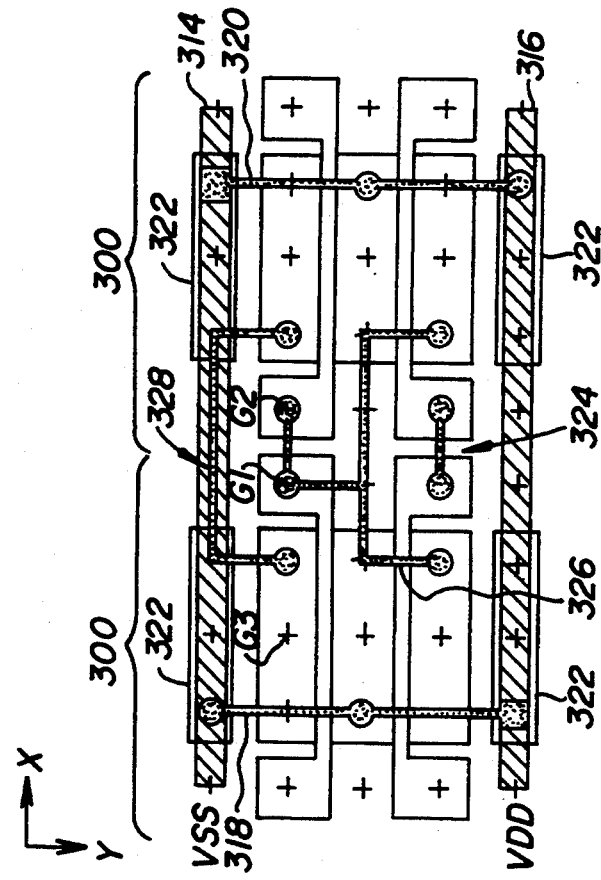
FIGS. 5A and 5B are respectively diagrams showing disadvantages obtained when conventional transistor arrangements are used.

FIG. 5A shows a conventional CMOS area including two conventional transistor areas 300, each being formed in the same manner as shown in FIG. 1. The following wiring lines are laid in order to form the logic circuit shown in FIG. 6A. A wiring line 310 is in contact with the four gate electrodes via four respective contacts thereof, and serves as the input terminal. A wiring line 312 is in contact with the central diffused regions of the transistor arrangements 300. Power supply lines 314 and 316 are provided in the same manner as shown in FIG. 4A, and wiring lines 318 and 320 are provided in the same manner as shown in FIG. 4A. The power supply lines 314 and 316 extend above substrate contact layers 322.

The arrangement shown in FIG. 4A is superior to the arrangement shown in FIG. 5A as follows. In the Y direction, the wire line 210 for the gate contacts shown in FIG. 4A has a length corresponding to two grids, while the wire line 310 for the gate contacts shown in FIG. 5A has a length corresponding to three grids. Hence, the arrangement shown in FIG. 4A has an increased degree of freedom regarding the layout of other wiring lines. For example, as shown in FIG. 4A, the wiring line 212 forming the output terminal of the logic circuit shown in FIG. 6A is allowed to extend above the gate electrodes (wide portions thereof) of the transistor arrangements 200. On the other hand, it can be seen from FIG. 5A that it is not impossible to lay the wiring line 312 above the gate electrodes (wide portions) of the transistor arrangements 300 due to the presence of the wiring line 310. In the arrangement, the wiring line 312 underlies the power supply line 314.

If it is required that a wiring line (not shown) which extends above the wiring line 212 in the X direction be in contact with the wiring line 212 at grid G1 or G2, such a contact can be made without overlapping of contacts (via holes). This is because neither grid G1 nor G2 is used for making contact with tile gate electrodes. It will be noted that the overlapping of contacts respectively formed at the same grid position can be formed by the current production process. However, this production process increases the production cost of semiconductor integrated circuit devices. In this regard, generally, it is not desirable that contacts are formed at the same grid position so that they overlap each other. On the other hand, if it is required that a wiring line (not shown) which extends above the wiring line 310 in the X direction be in contact with the wiring line 310 at the grid G1 or G2, the overlapping takes place. This is because the wiring line 310 is in contact with the gates at the grids G1 and G2.

FIG. 4B shows a CMOS transistor area having the two transistor arrangements 200 according the present invention, in which wiring lines are provided in order to form a logic circuit shown in FIG. 6B. The logic circuit shown in FIG. 6B comprises two cascaded inverters. In FIG. 4B, parts which are the same as those shown in FIG. 4A are given the same reference numerals. A wiring line 224 connects the gates of the CMOS inverter at the first stage of the logic circuit shown in FIG. 6B to each other. The wiring line 224 serves as an input terminal of the logic circuit. A wiring line 226 connects the gates of the complementary transistors of the CMOS inverter at the second stage and the drains of the complementary transistors of the CMOS inverter at the first stage. A wiring line 228 connects the drains of the CMOS inverter at the second stage. The wiring line 228 serves as an output terminal of the logic circuit.

Figure 5B:
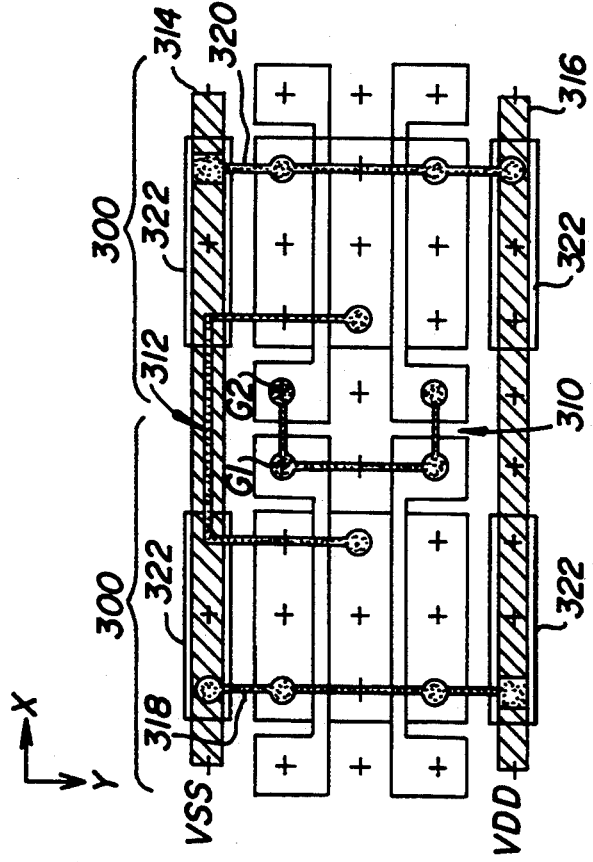

FIG. 5B shows a conventional CMOS area including two conventional transistor areas 300, each being formed in the same manner as shown in FIG. 1. The following wiring lines are laid in order to form the logic circuit shown in FIG. 6B. In FIG. 5B, parts which are the same as those shown in FIG. 4B are given the same reference numerals. A wiring line 324 connects the gates of the complementary transistors of the CMOS inverter at the first stage of the logic circuit shown in FIG. 6B to each other. The wiring line 324 serves as the input terminal of the logic circuit shown in FIG. 6B. A wiring line 326 connects the gates of the complementary transistors of the CMOS inverter at the second stage and the drains of the complementary transistors of the CMOS inverter at the first stage. A wiring line 328 connects the drains of the complementary transistors of the CMOS inverter at the second stage. The wiring line 328 serves as the output terminal of the logic circuit shown in FIG. 6B.

The arrangement shown in FIG. 4B has the same advantages as the arrangement shown in FIG. 4A, while the arrangement shown in FIG. 5B has the same disadvantages as the arrangement shown in FIG. 5B. That is, the wiring line 226 has a Y-direction length corresponding to two grids, while the wiring line 326 has a Y-direction length corresponding to three grids. The wiring line 228 extends above the grids G1 and G2, while the wiring line 328 underlies the power supply line 314. In FIG. 4B, it is possible for a wiring line (not shown) located at the second wiring-layer-level to make contact with the wiring line 228 at the grid G1 or G2 without overlapping of contacts. On the other hand, in FIG. 5B, it is impossible for a wiring line (not shown) located at the second wiring-layer-level to make contact with the wiring line 228 at the grid G1 or G2 without overlapping of contacts.

The arrangement shown in FIG. 4B has a further advantage, while the arrangement shown in FIG. 5B has a further disadvantage. In FIG. 5B, when it is required that a wiring line (not shown) located at the second wiring-layer-level be in contact with the wiring line 328 without overlapping of contacts, the above wiring line must make contact with an extended portion (not shown) of the wiring line 328 at, for example, grid G3. When such a contact with the wiring line 328 is made at the grid G3, it is impossible to lay another wiring line which is located at the first wiring-layer-level and which extends over the grid G3 in the Y direction because of the above contact formed at the grid G3.

With the above in mind, generally, each of the three diffused region is provided with four grids. In this case, it is possible to lay another wiring line which is located at the first wiring-layer-level and which extends over the "fourth" grid in the Y direction even when the contact with the wiring line 328 is made at the grid G3. Hence, the arrangement shown in FIG. 5B has a very small degree of freedom of layout of wiring lines.

On the other hand, a contact between a wiring line (not shown) located at the second wiring-layer-level and the wiring line 228 can be made at the grid G1 or G2 without overlapping of contacts. Hence, it is possible to lay another wiring line which is located at the first wiring-layer-level and which extends over the grid G3 in the Y direction. That is, it is not necessary to increase the number of grids in each of the diffused regions in order to lay another wiring line extending in the Y direction.

It will be noted that each of the gate electrodes has a bent portion 250 as shown in FIGS. 4A and 4B. By forming the bent portion 250, it becomes possible to keep the distance between adjacent gate electrodes constant.

A variety of basic cells can be made by combining a plurality of transistor arrangements each having the structure shown in FIG. 3, as will be described later.

A description will now be given of embodiments of the present invention.

Figure 7:
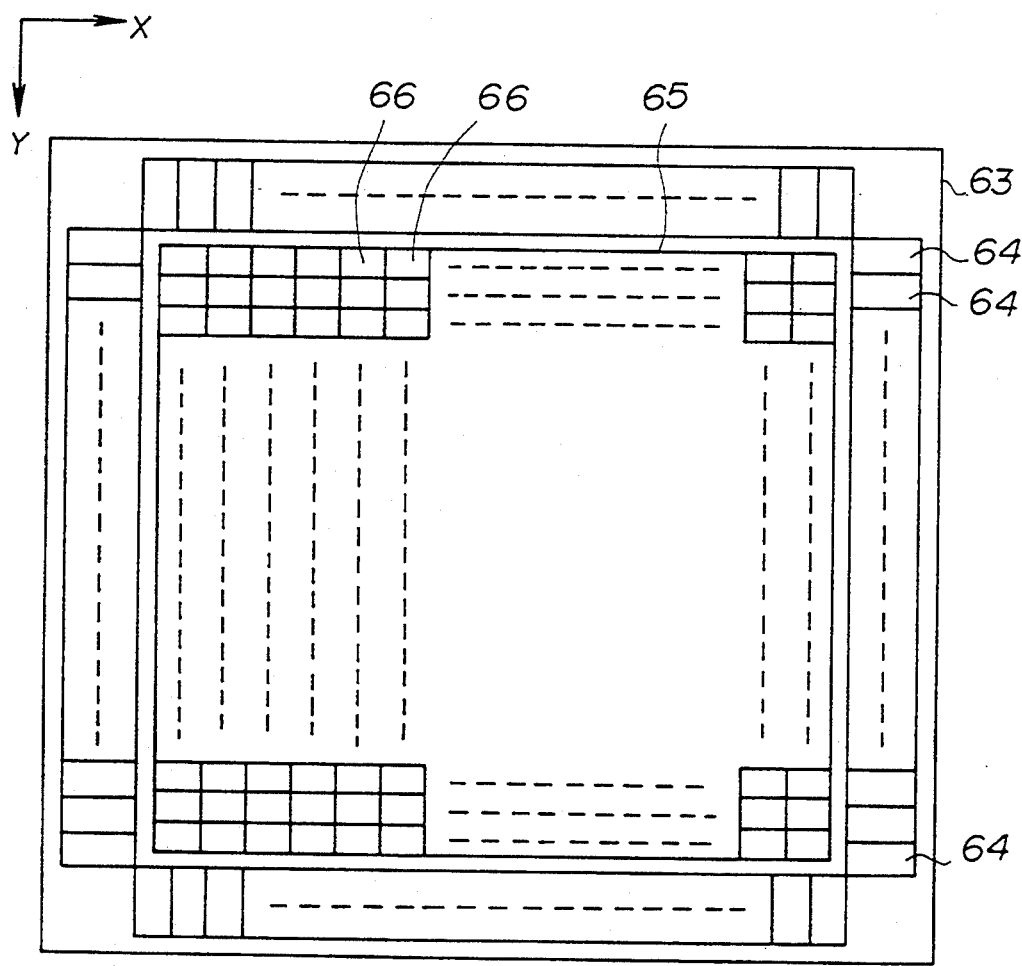
FIG. 7 is a plan view of a semiconductor integrated circuit device having a large number of basic cells each having a transistor arrangement as shown in FIG. 3.

FIG. 7 is a plan view of a semiconductor integrated circuit device having a large number of basic cells, each of which cells has a plurality of transistor arrangements as shown in FIG. 3. The device shown in FIG. 7 comprises a chip 63, input/output cells 64, a basic cell area 65, and basic cells 66 arranged in rows and columns in the basic cell area 65. The first embodiment of the present invention is a master-slice type semiconductor integrated circuit device as shown in FIG. 8.

Figure 8:
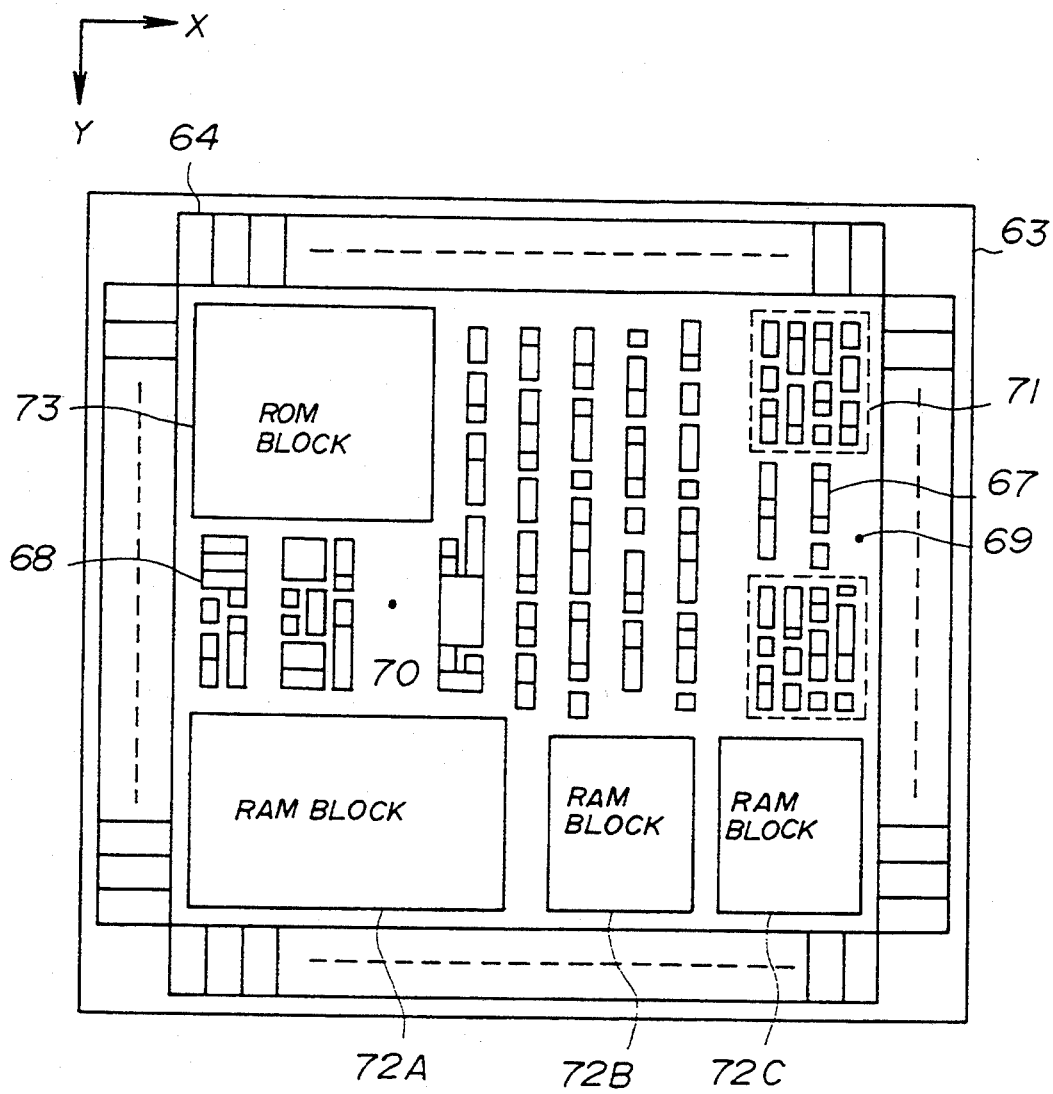
FIG. 8 is a plan view of a master-slice type semiconductor integrated circuit device according to a first embodiment of the present invention.

The master-slice type semiconductor integrated circuit device shown in FIG. 8 comprises logic unit cells, each of which has an X-direction width equal to the width of one basic cell. The device also comprises logic unit cells, each of which has an X-direction width twice the width of one basic cell. A wiring channel area 69 has an X-direction width equal to that of one basic cell. A wiring channel area 70 has an X-direction with twice the width of one basic cell. A logic unit cell 71 has basic cells arranged without wiring channel areas. There are RAM blocks 72A, 72B and 72C, and a ROM block 73.

Figure 9:
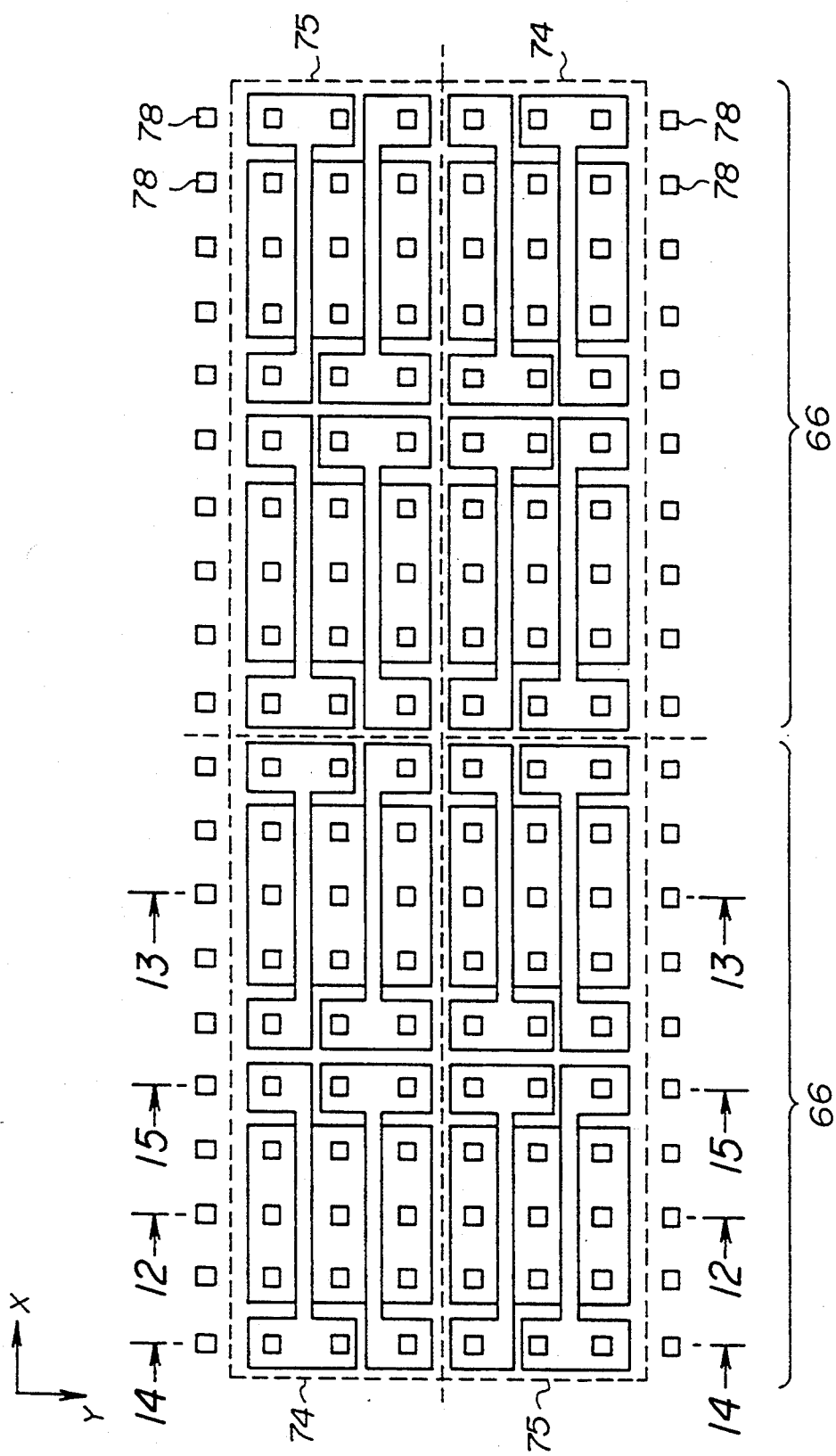
FIG. 9 is a plan view showing a part of a basic cell area shown in FIG. 7.

FIG. 9 is a plan view showing a part of the basic cell area 65 shown in FIG. 7. Each of the basic cells shown in FIG. 9 comprises CMOS transistor areas 74 and 75 arranged side by side in the Y direction. The CMOS transistor areas 74 and 75 have arrangements different from each other on the plan view. More specifically, the CMOS transistor areas 74 and 75 are symmetrical with each other across a boundary line extending in the X direction. Substrate contacts 78 formed in substrate contact areas are arranged in a line along each longitudinal end of each of the basic cells 66.

Figure 10:
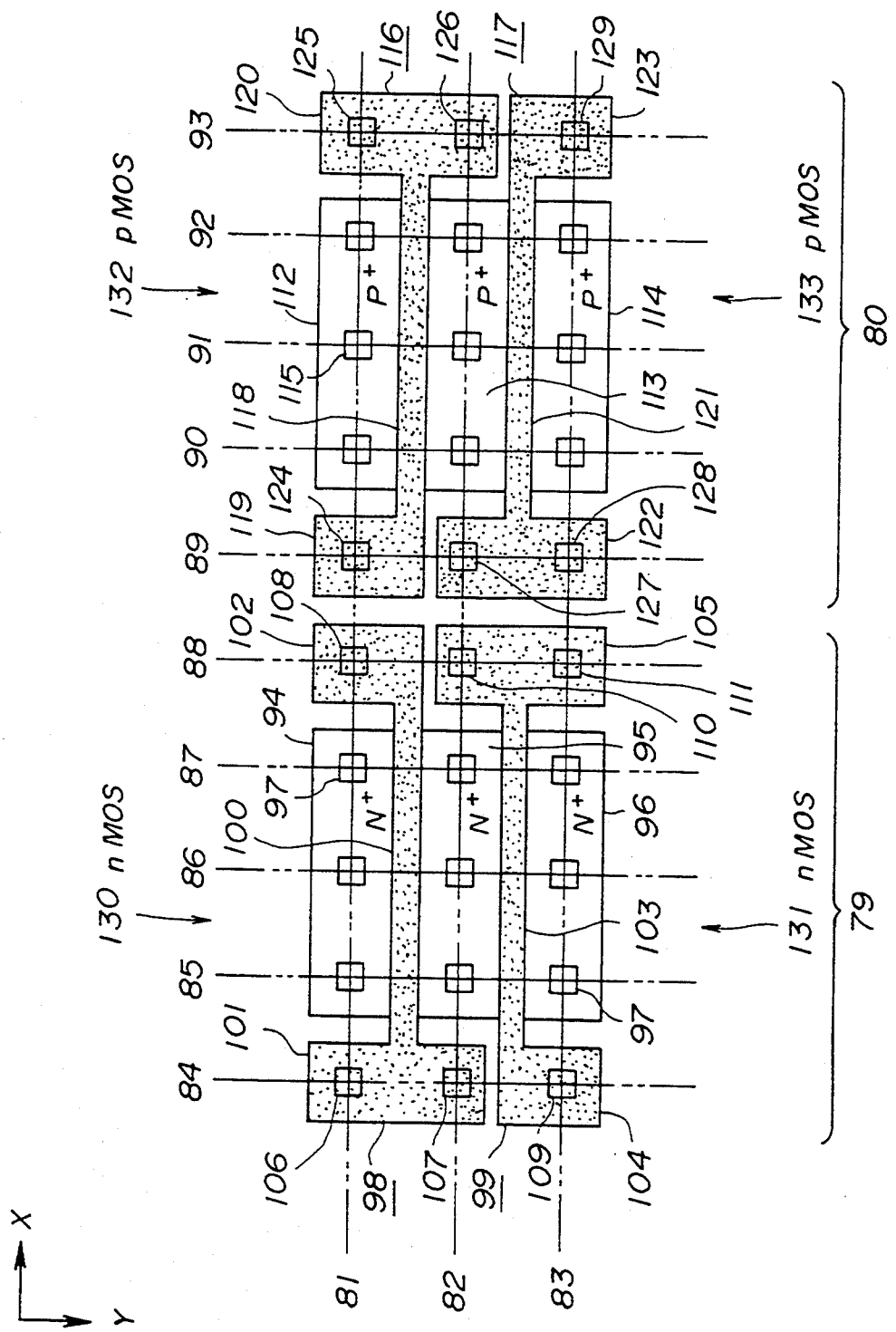
FIG. 10 is a plan view of a CMOS transistor area shown in FIG. 9.

FIG. 10 is a plan view of the CMOS transistor area 74, which comprises an nMOS transistor area 79 and a pMOS transistor area 80, which are arranged side by side in the X direction. Wiring channels 81-83, which are spaced apart from each other at predetermined intervals in the Y direction, extend in the X direction. Wiring channels 84-93 extend in the Y direction, and are spaced apart from each other at predetermined intervals in the X direction. The nMOS transistor 79 comprises N+-type diffused regions 94–96, which are arranged side by side in the Y direction. Each of the diffused regions 94–96 has three contact areas 97, which are located at predetermined grids and arranged in a line in the X direction.

Two gate electrodes 98 and 99 are made of polysilicon. The gate electrode 98 has a narrow portion 100, a first wide portion 101 and a second wide portion 102. The gate electrode 99 has a narrow portion 103, a first wide portion 104 and a second wide portion 105. The narrow portion 100 of the gate electrode 98 extends in the X direction, and is located above the N+-type diffused regions 94 and 95. The first wide portion 101 is connected to a left end of the narrow portion 100, and is located outside of left ends of the N+-type diffused regions 94 and 95 on the plan view of FIG. 10. The first wide portion 101 has gate contact areas 106 and 107 respectively located at cross points at which the wiring channel 84 crosses the wiring channels 81 and 82, respectively. That is, the gate contact areas 106 and 107 are arranged in a line in the Y direction. The second wide portion 102 of the gate electrode 98 is connected to a right end of the narrow portion 100, and located outside a right end of the N+-type diffused region 94 on the plan of FIG. 10. The second wide portion 102 has a gate contact area 108 located at a cross point at which the wiring channels 81 and 88 cross each other.

The narrow portion 103 of the gate electrode 99 extends, in the X direction, above a channel area between the N+-type diffused regions 95 and 96. The first wide portion 104 of the gate electrode 99 is connected to a left end of the narrow portion 103, and located outside a left end of the impurity diffused region 96 on the plane of FIG. 10. The first wide portion 104 has a single gate contact area 109 at a cross point at which the wiring channel 83 crosses the wiring channel 84. The second wide portion 105 of the gate electrode 99 is connected to a right end of the narrow portion 103, and located outside respective left ends of the N+-type diffused regions 95 and 96. The second wide portion 105 has gate contact areas 110 and 111 located at cross points at which the wiring channel 88 crosses the wiring channels 82 and 83, respectively.

The pMOS transistor area 80 comprises P+-type diffused regions 112–114, which are located side by side in the Y direction and respectively located under the wiring channels 81–83. Each of the diffused regions 112–114 has the three contact areas 115 arranged in a line in the X direction. The pMOS transistor area 80 comprises two gate electrodes 116 and 117. The gate electrode 116 comprises a narrow portion 118, a first wide portion 119, and a second wide portion 120. The gate electrode 117 comprises a narrow portion 121, a first wide portion 122, and a second wide portion 123.

The narrow portion 118 of the gate electrode 116 extends in the X direction, and is located above the P+-type diffused regions 112 and 113. The first wide portion 119 is connected to a left end of the narrow portion 118, and is located outside of a left end of the N+-type diffused region 112 on the plan view of FIG. 10. The first wide portion 119 has a gate contact area 124 located at a cross point at which the wiring channel 81 crosses the wiring channel 81. The second wide portion 120 of the gate electrode 116 is connected to a right end of the narrow portion 118, and located outside respective right ends of the P+-type diffused regions 112 and 113 on the plan of FIG. 10. The second wide portion 120 has gate contact areas 125 and 136 located at cross points at which the wiring channel 93 cross the wiring channels 81 and 82, respectively.

The narrow portion 121 of the gate electrode 117 extends, in the X direction, above a channel area between the P+-type diffused regions 113 and 114. The first wide portion 122 of the gate electrode 117 is connected to a left end of the narrow portion 121, and located outside respective left ends of the impurity diffused region 113 and 114 on the plane of FIG. 10. The first wide portion 122 has two gate contact areas 127 and 128 at cross points at which the wiring channel 89 crosses the wiring channels 82 and 83. The second wide portion 123 of the gate electrode 117 is connected to a right end of the narrow portion 121, and located outside a left end of the P+-type diffused region 114. The second wide portion 123 has a single gate contact area 129 located at a cross point at which the wiring channel 93 crosses the wiring channel 83.

The CMOS transistor area 74 comprises an nMOS transistor 130 formed by the N+-type diffused regions 94 and 95 and the gate electrode 98, and an nMOS transistor 131 formed by the N+-type diffused regions 95 and 96 and the gate electrode 99. Further, the P+-type diffused regions 112 and 113 and the gate electrode 116 form a pMOS transistor 132, and the P+-type diffused regions 113 and 114 and the gate electrode 117 forms a pMOS transistor 133.

Figure 11:
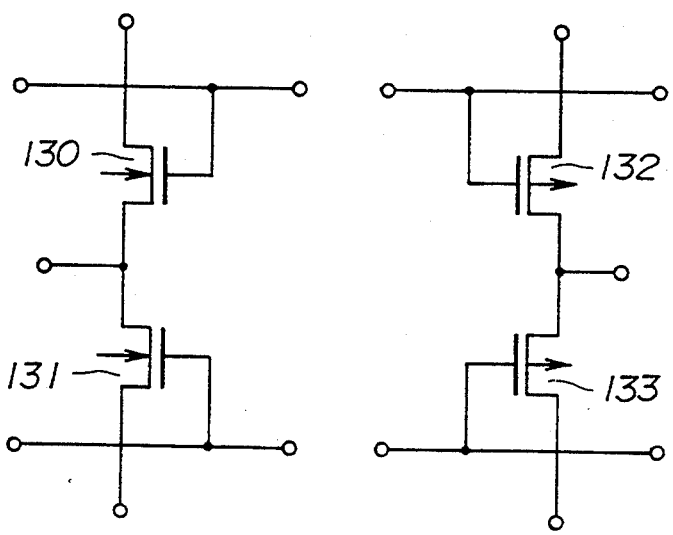
FIG. 11 is an equivalent circuit diagram of circuits formed in the CMOS transistor area shown in FIG. 10.
Figure 12:
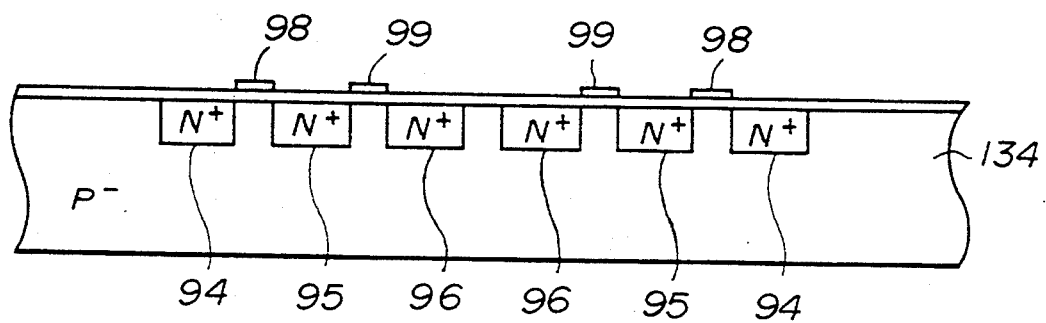
FIGS. 12, 13, 14 and 15 are diagrams respectively taken along lines A—A, B—B, C—C and D—D shown in FIG. 9.
Figure 13:
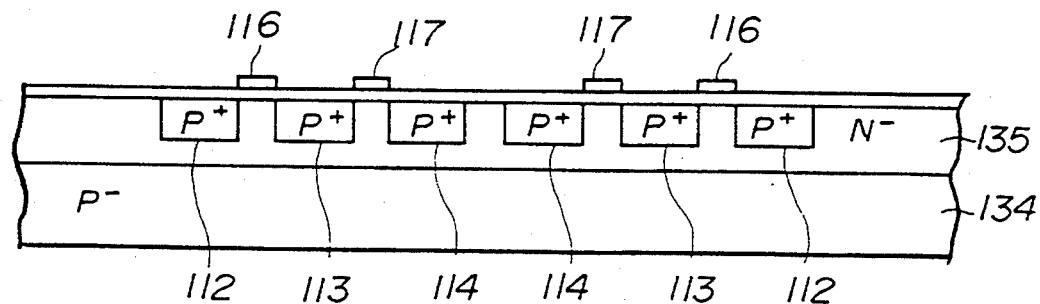
Figure 14:
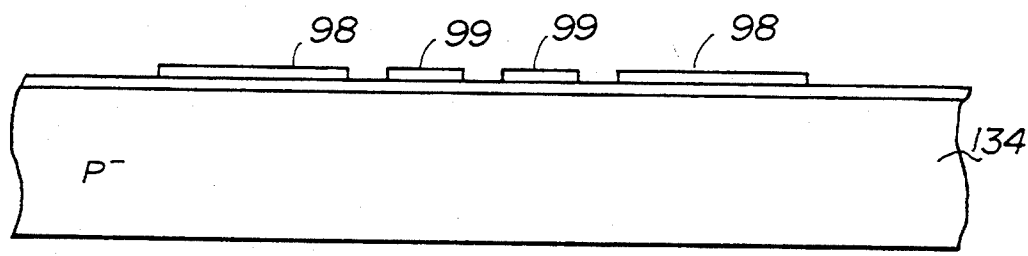
Figure 15:
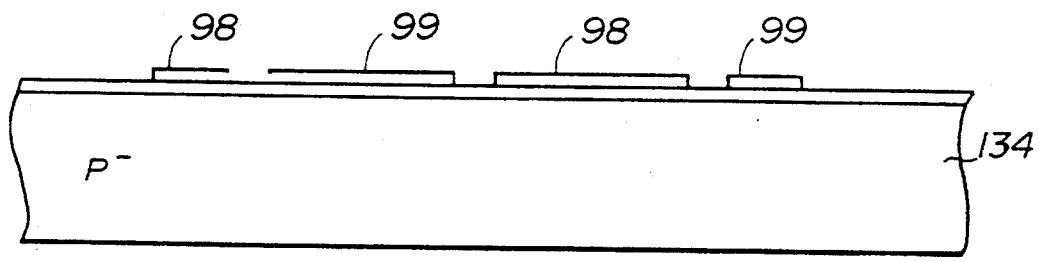

FIG. 11 is an equivalent circuit diagram of circuits formed in the CMOS transistor area 74. The CMOS transistor area 75 can be seen to have an identical arrangement by rotating the CMOS transistor area 74 by 180° about the X axis.

FIGS. 12, 13, 14 and 15 are respectively diagrams respectively taken along lines A—A, B—B, C—C and D—D shown in FIG. 9. Gate insulation films underlying the gate electrodes are omitted for the sake of convenience.

Figure 16:
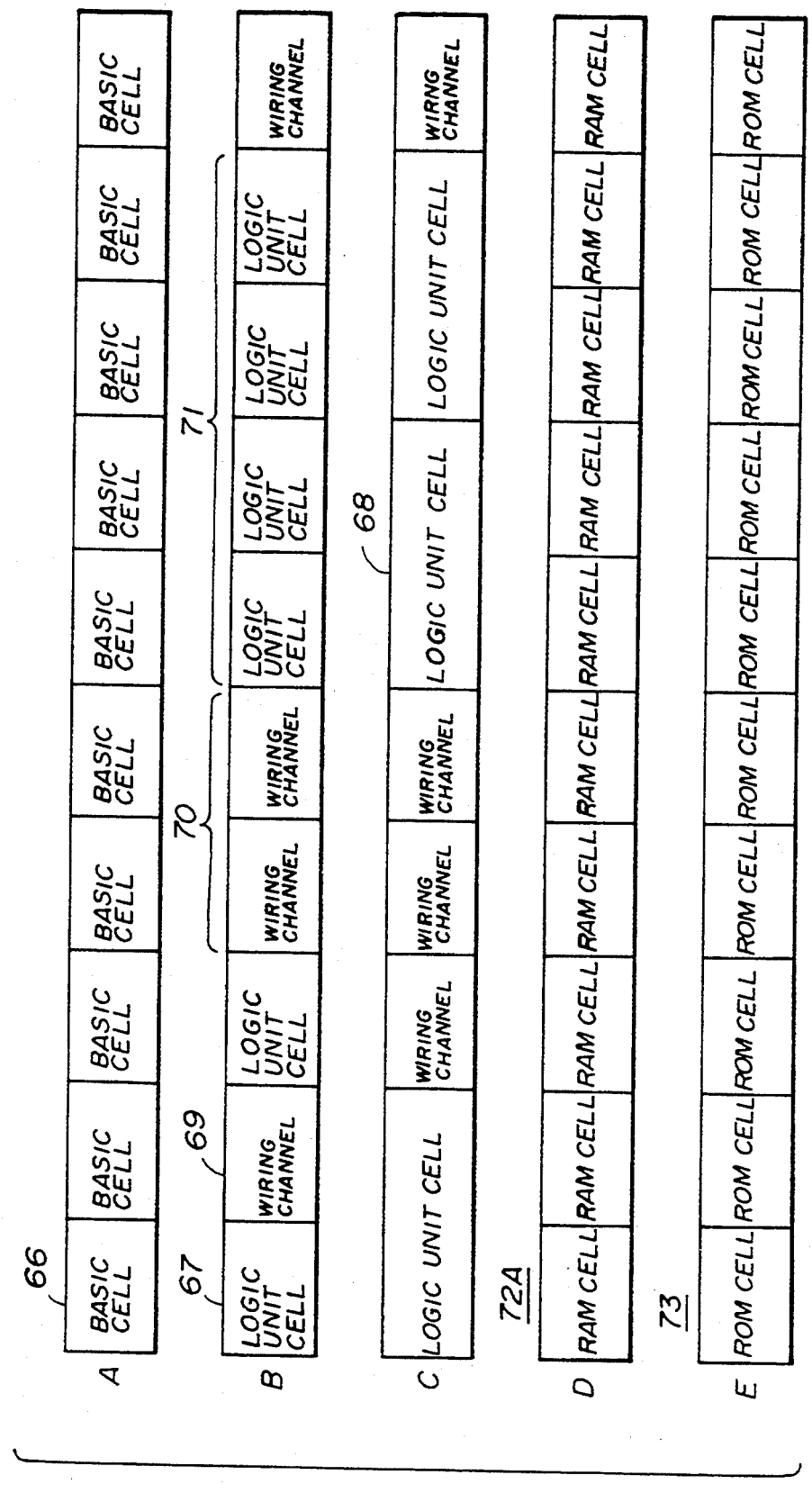
FIG. 16 are diagrams showing applications of the basic cells in the first embodiment of the present invention.

The basic cells 66 configured as mentioned above are used as shown in FIG. 16, for example. FIG. 11-A shows an arrangement of basic cells 66 in the X direction. FIG. 11-B and FIG. 11-C respectively show arrangements containing logic unit cells 67 and wiring channels 69. FIG. 11-D shows an arrangement of RAM cells 72A in the X direction. FIG. 11-E shows an arrangement of ROM cells 73 in the X direction. According to the first embodiment of the present invention, it is possible to design an arrangement in which the logic cell units and wiring channels have identical widths each equal to the width of one basic cell. Hence, the first embodiment has a high degree of freedom regarding the allocation of logic unit cells and selection of wiring channels. It is also possible to design an arrangement in which the ROM cells and RAM cells have identical width each equal to the width of one basic cell.

Figure 17:
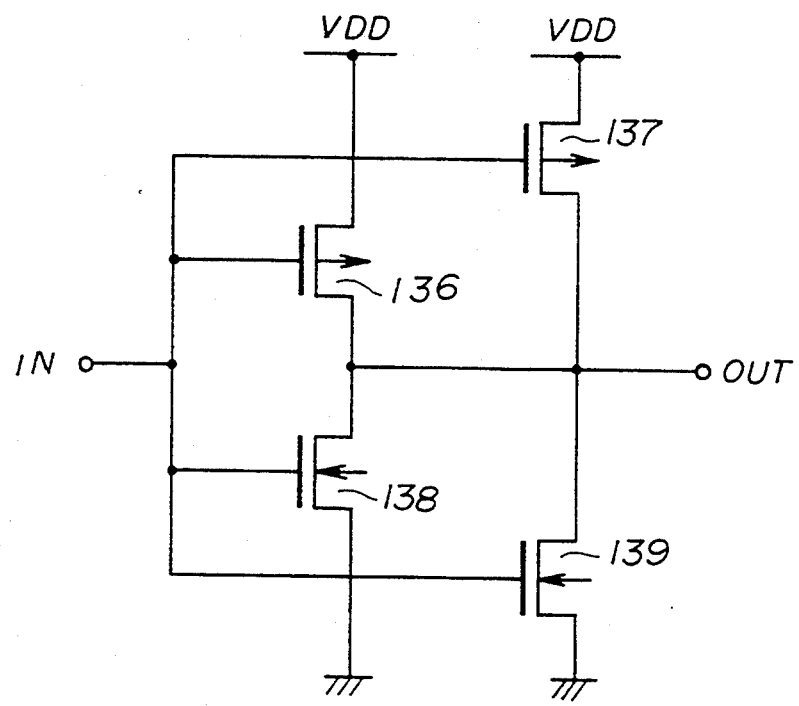
FIG. 17 is a circuit diagram of an inverter.
Figure 18:
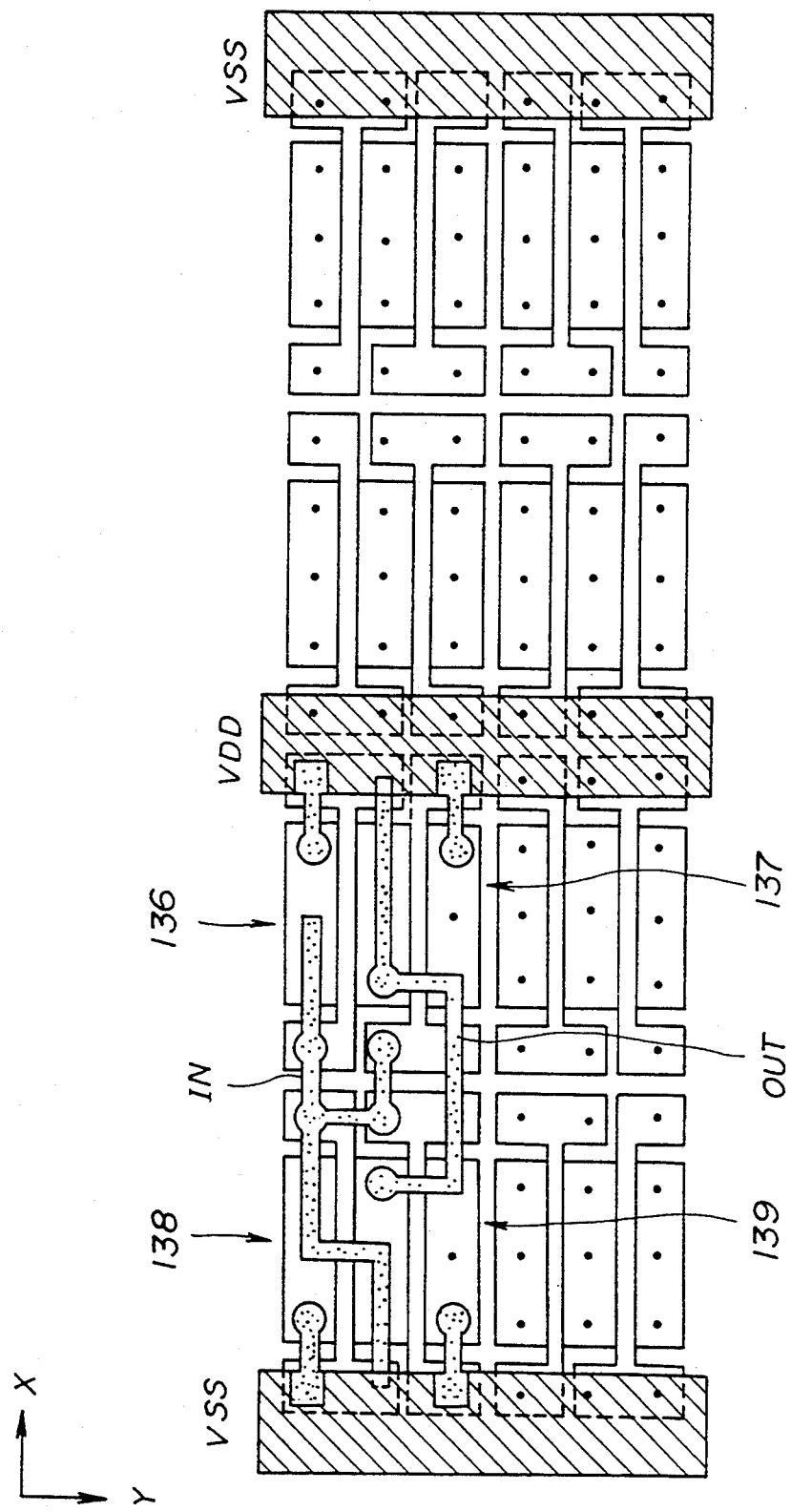
FIG. 18 is a plan view of the inverter shown in FIG. 17.

An inverter as shown in FIG. 17 can be formed as shown in FIG. 18. The inverter shown in these figures includes pMOS transistors 136 and 137, and nMOS transistors 138 and 139. In FIG. 18, a stippled strip denotes an aluminum wiring line located at the first wiring-layer-level. The symbols used in FIG. 18 have the same meanings as those shown in FIGS. 4A, 4B, 5A and 5B. Symbol "." denotes a grid and corresponds to the aforementioned symbol "+" It will be noted that power supply lines having potentials VSS and VDD extend in the Y direction. This arrangement of the power supply lines is different from that shown in FIGS. 4A and 4B.

Figure 19:
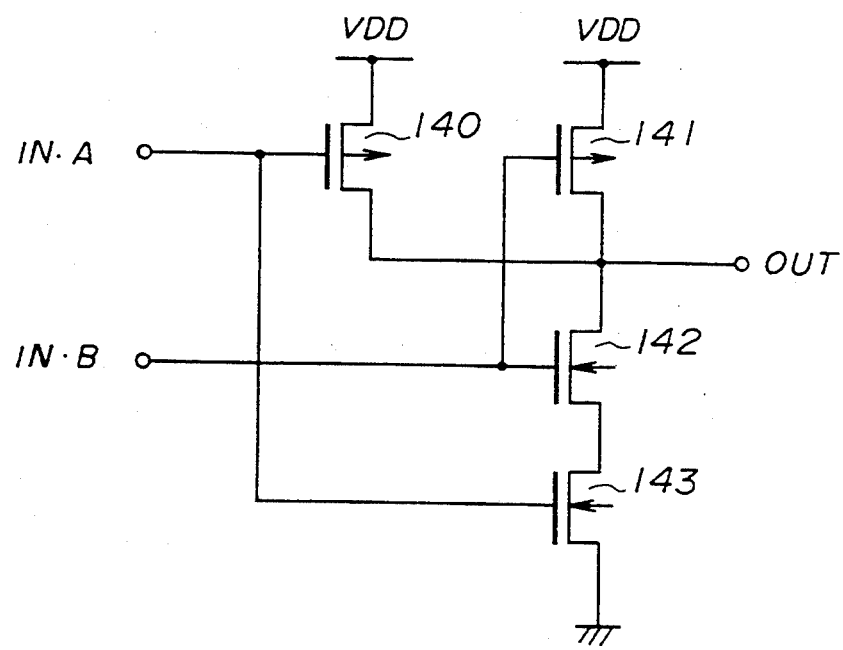
FIG. 19 is a circuit diagram of a NAND circuit.
Figure 20:
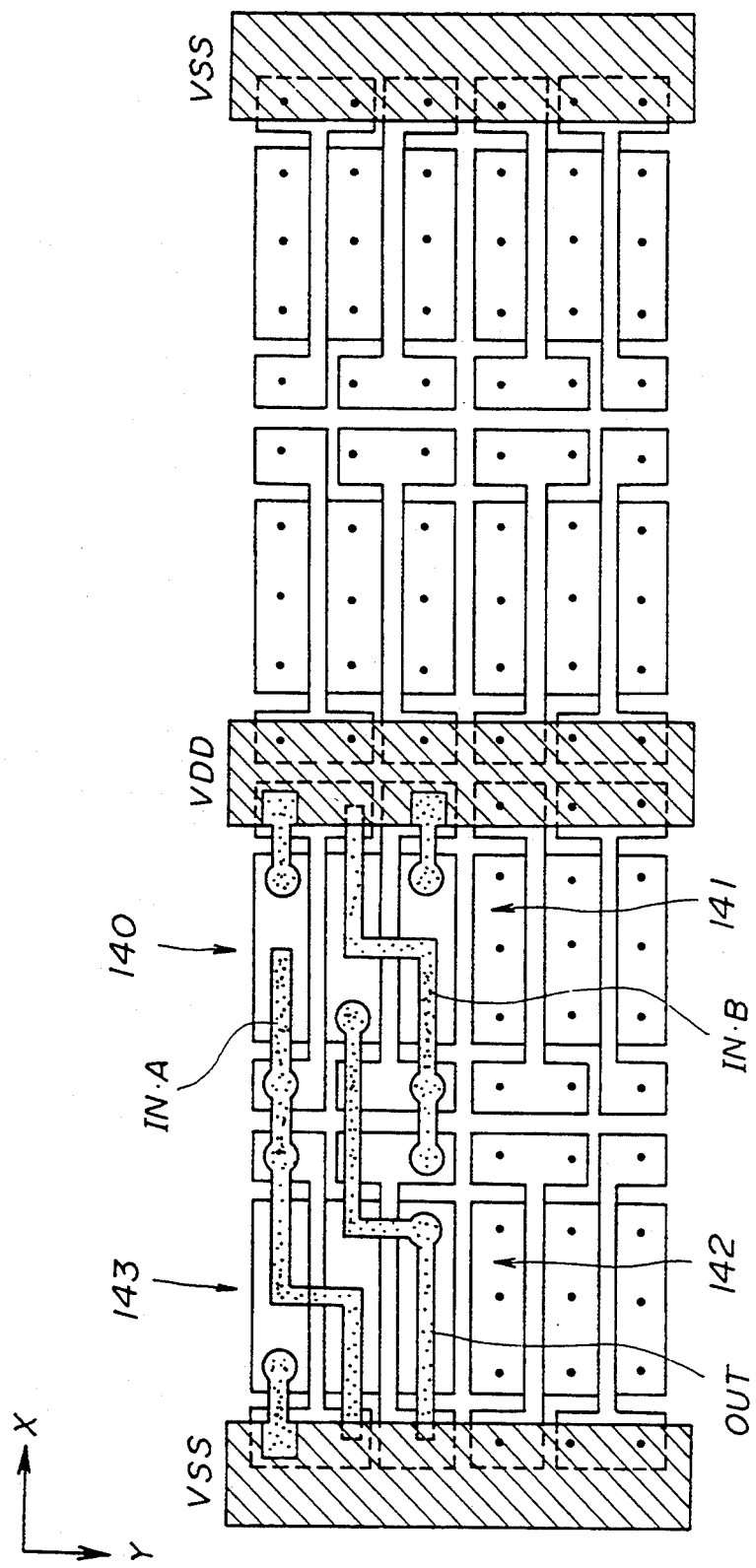
FIG. 20 is a plan view of the NAND circuit shown in FIG. 19.

A two-input NAND circuit as shown in FIG. 19 can be formed as shown in FIG. 20. The two-input NAND circuit shown in FIG. 19 comprises pMOS transistors 140 and 141, and nMOS transistors 142 and 143. As shown in FIG. 20, the power supply lines extend in the Y direction.

Figure 21:
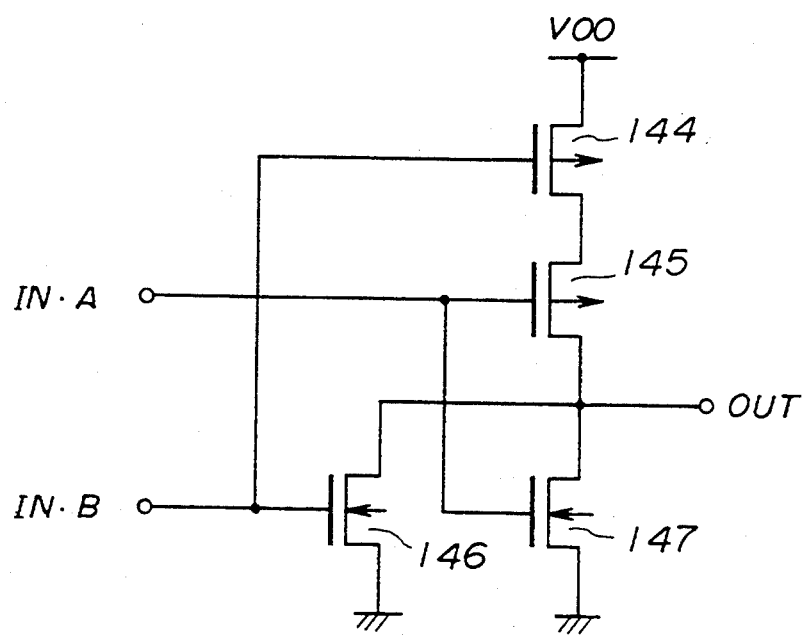
FIG. 21 is a circuit diagram of a NOR circuit.
Figure 22:
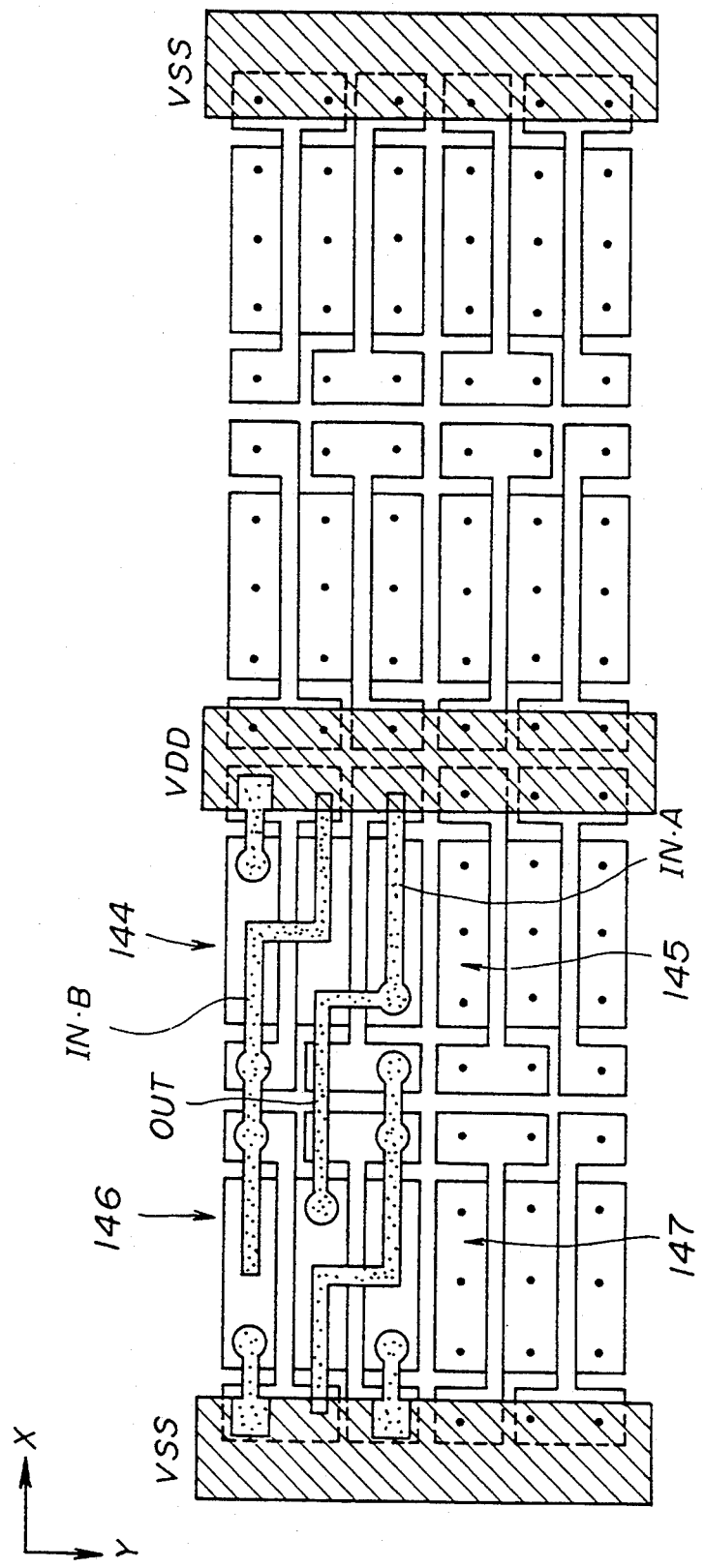
FIG. 22 is a plan view of the NOR circuit shown in FIG. 21.

A NOR circuit as shown in FIG. 21 can be formed as shown in FIG. 22. The NOR circuit shown in these figures includes pMOS transistors 144 and 145, and nMOS transistors 146 and 147.

Figure 23:
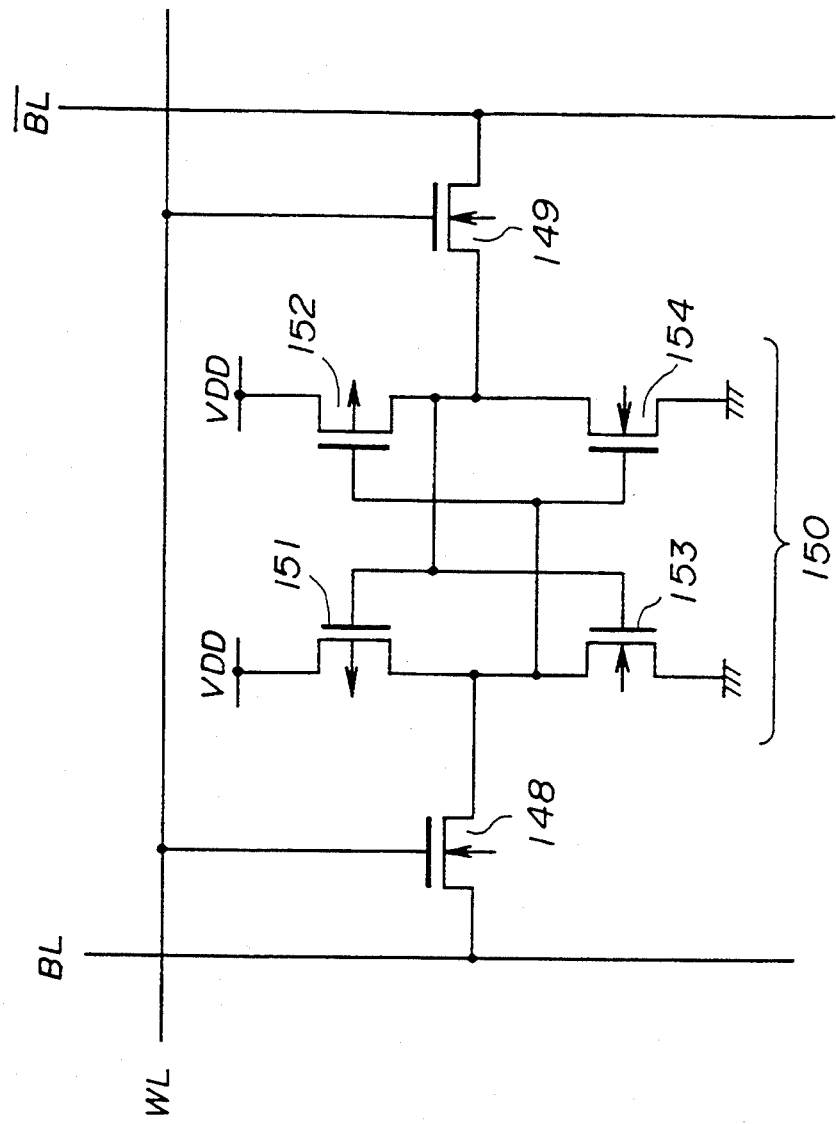
FIG. 23 is a circuit diagram of a single-port RAM cell.
Figure 24:
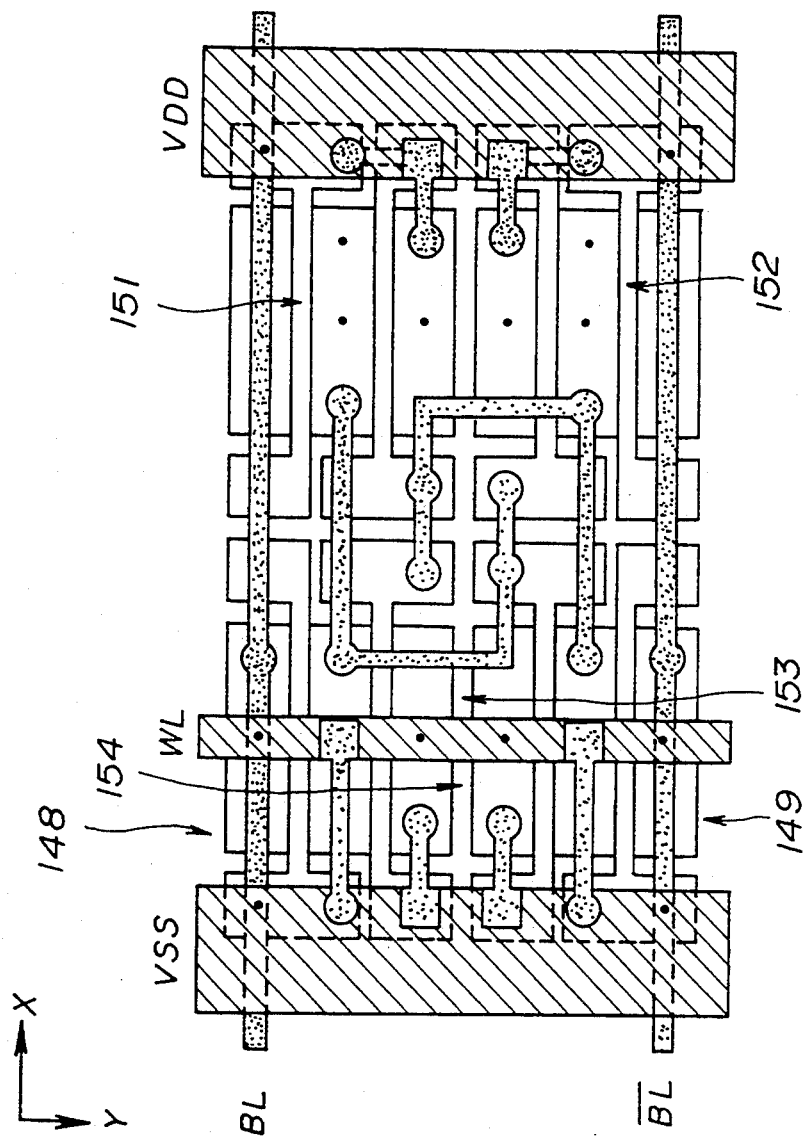
FIG. 24 is a plan view of the single-port RAM cell shown in FIG. 23.

A single-port RAM cell as shown in FIG. 23 can be formed as shown in FIG. 24. In these figures, WL indicates a word line, and BL and /BL (which corresponds to BL bar) indicate bit lines. The RAM cell shown in FIGS. 23 and 24 comprises nMOS transistors 148 and 149 respectively serving as transfer gates, and a flip-flop 150 serving as a storage element. The flip-flop 150 comprises pMOS transistors 151 and 152, and nMOS transistors 153 and 154.

Figure 25:
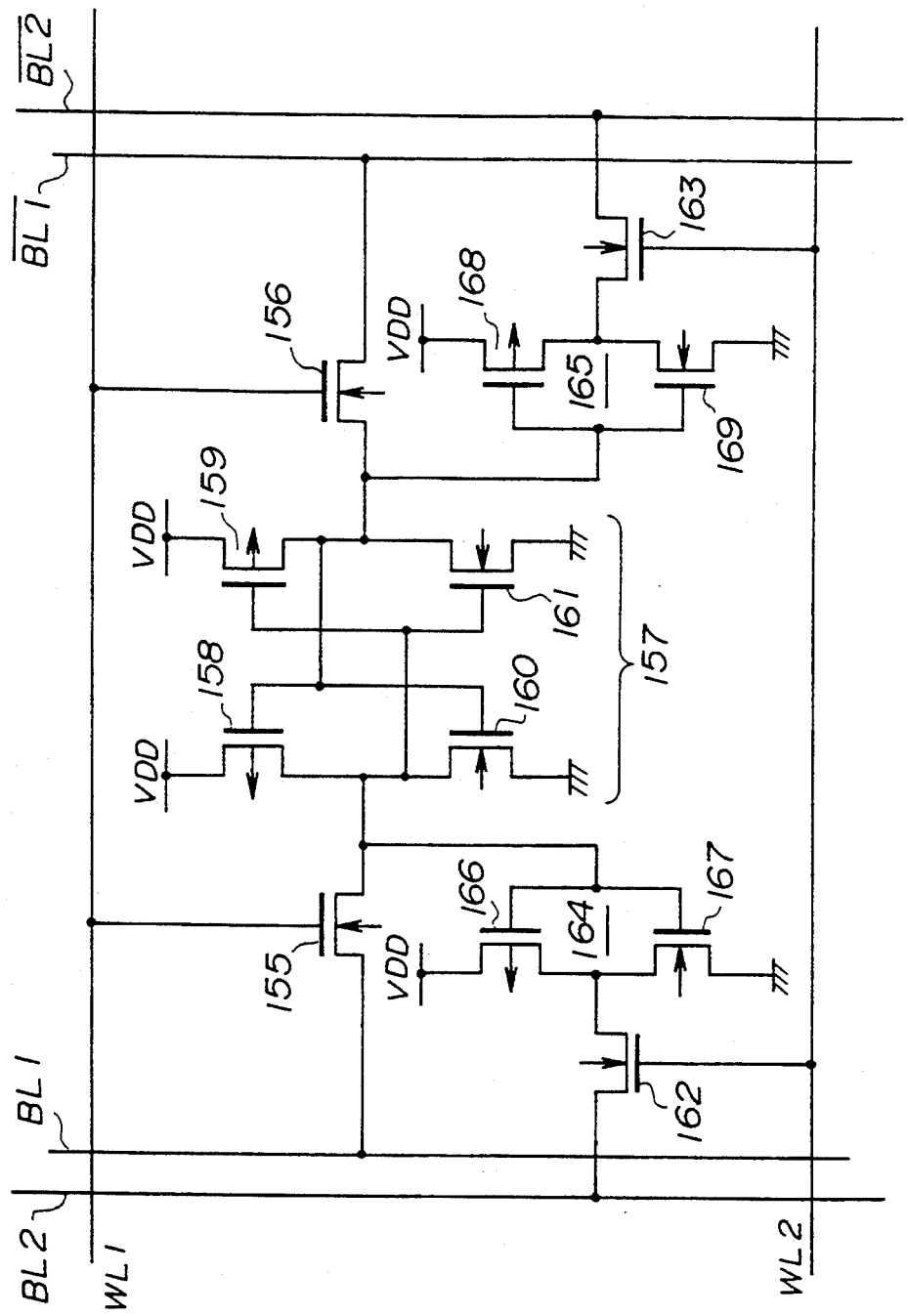
FIG. 25 is a circuit diagram of a dual-port RAM cell.
Figure 26:
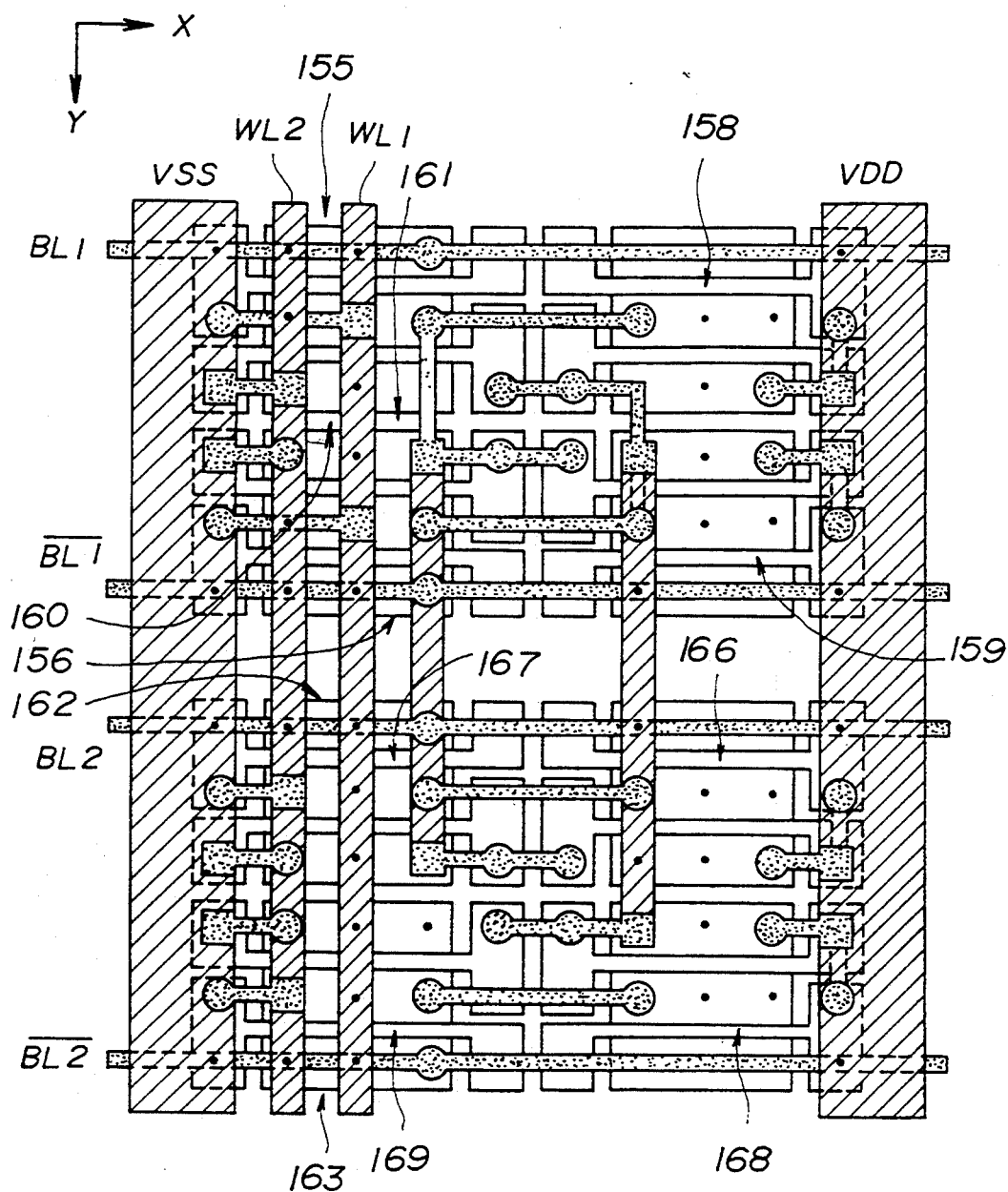
FIG. 26 is a plan view of the dual-port RAM cell shown in FIG. 25.

A dual-port RAM cell as shown in FIG. 25 can be formed as shown in FIG. 26. In these figures, WL1 indicates a first-port word line, BL1 and /BL1 respectively indicate first-port bit lines, WL2 indicates a second-port word line, and BL1 and /BL1 respectively indicate second-port bit lines. The dual-port RAM comprises nMOS transistors 155 and 156, which respectively serve as transfer gates controlled by the word line WL1, and a flip-flop 157 functioning as a storage element. The flip-flop 157 is made up of pMOS transistors 158 and 159, and nMOS transistors 160 and 161. Further, the dual-port RAM comprises nMOS transistors 162 and 163, which respectively serve as transfer gates controlled by the word line WL2, and an inverter 165 serving as a buffer. Furthermore, the dual-port RAM comprises a pMOS transistor 166 and an nMOS transistor 167, both of which form an inverter 164, and a pMOS transistor 168 and an nMOS transistor 169, both of which form an inverter 165.

Figure 27:
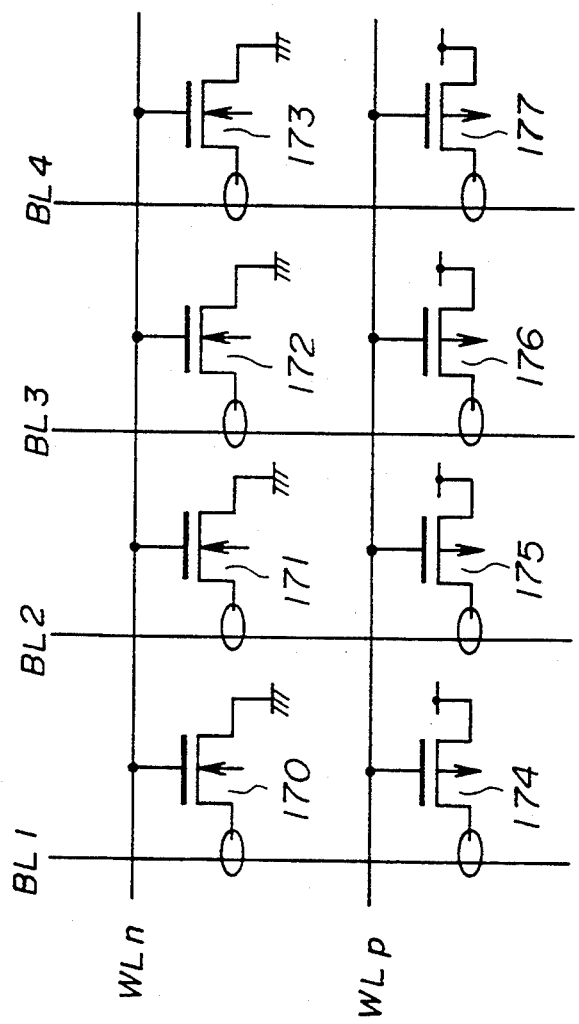
FIG. 27 is a circuit diagram of a ROM.
Figure 28:
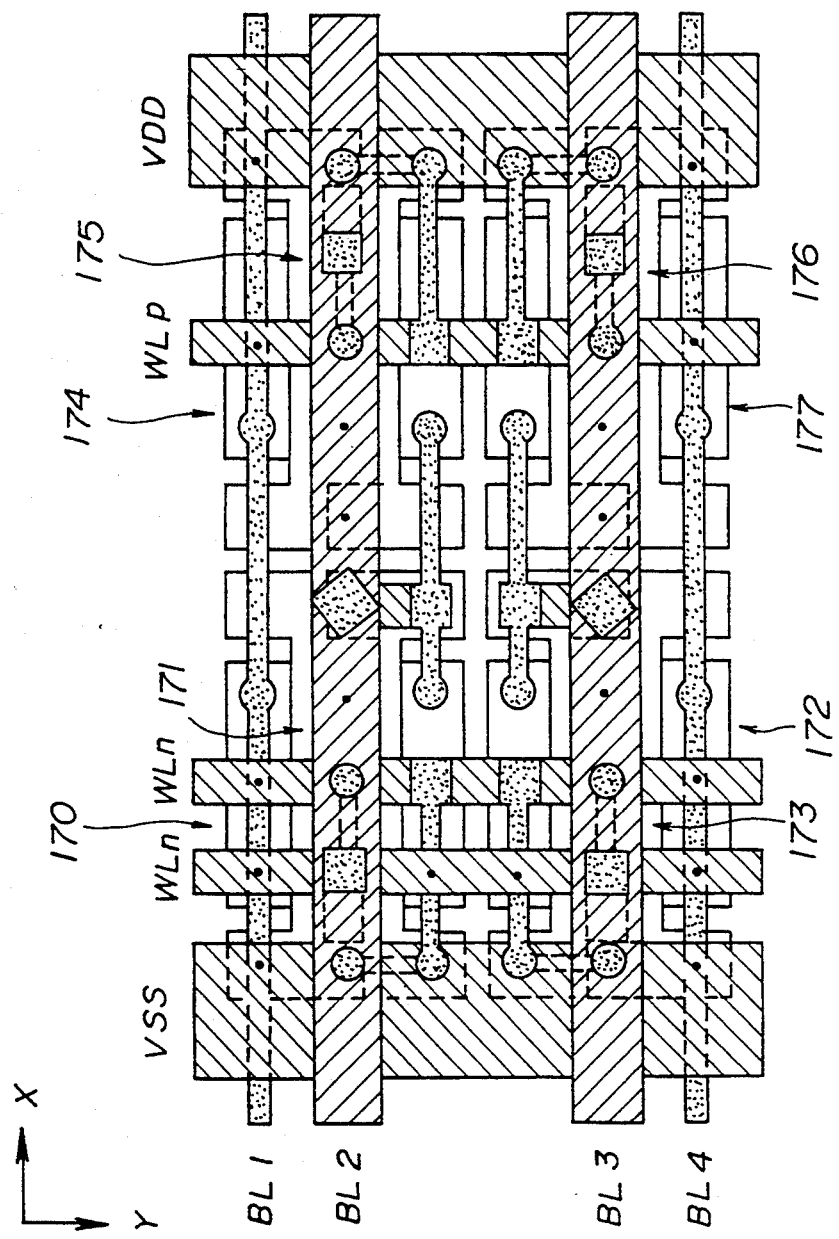
FIG. 28 is a plan view of the ROM shown in FIG. 27.

A ROM as shown in FIG. 27 can be formed as shown in FIG. 28. In these figures, WLn and WLp respectively indicate word lines, and BL1–BL4 respectively indicate bit lines. The ROM comprises nMOS transistors 170–173 respectively functioning as storage elements, and pMOS 174–177 respectively functioning as storage elements. A line having hatching obliquely running from the left to right denotes a wiring line located at a third wiring-layer-level, which is higher than the second wiring-layer-level. Symbol "♦" denotes a contact between the second and third wiring-layer-levels. The nMOS transistors 170–173 can be programmed by determining whether or not the drains of the nMOS transistors 170–173 should be respectively connected to the bit lines BL1–BL4. The pMOS transistors 174–177 can be programmed by determining whether or not the drains of the pMOS transistors 174–177 should be respectively connected to the bit lines BL1–BL4.

It can be seen from FIGS. 24 and 26 that most of the transistors are used to form the single-port and dual-port RAMs, respectively. A three-port RAM can be formed in a manner similar to the above. It can also be seen from FIG. 28 that the ROM cell is formed by all the transistors of the basic cell 66. In this manner, the logic unit cells, the RAM cells and ROM cells can be formed by efficiently using the basic cells of the first embodiment of the present invention. Of course, the first embodiment of the present invention has all the advantages of the arrangements shown in FIGS. 4A and 4B.

Figure 29A:
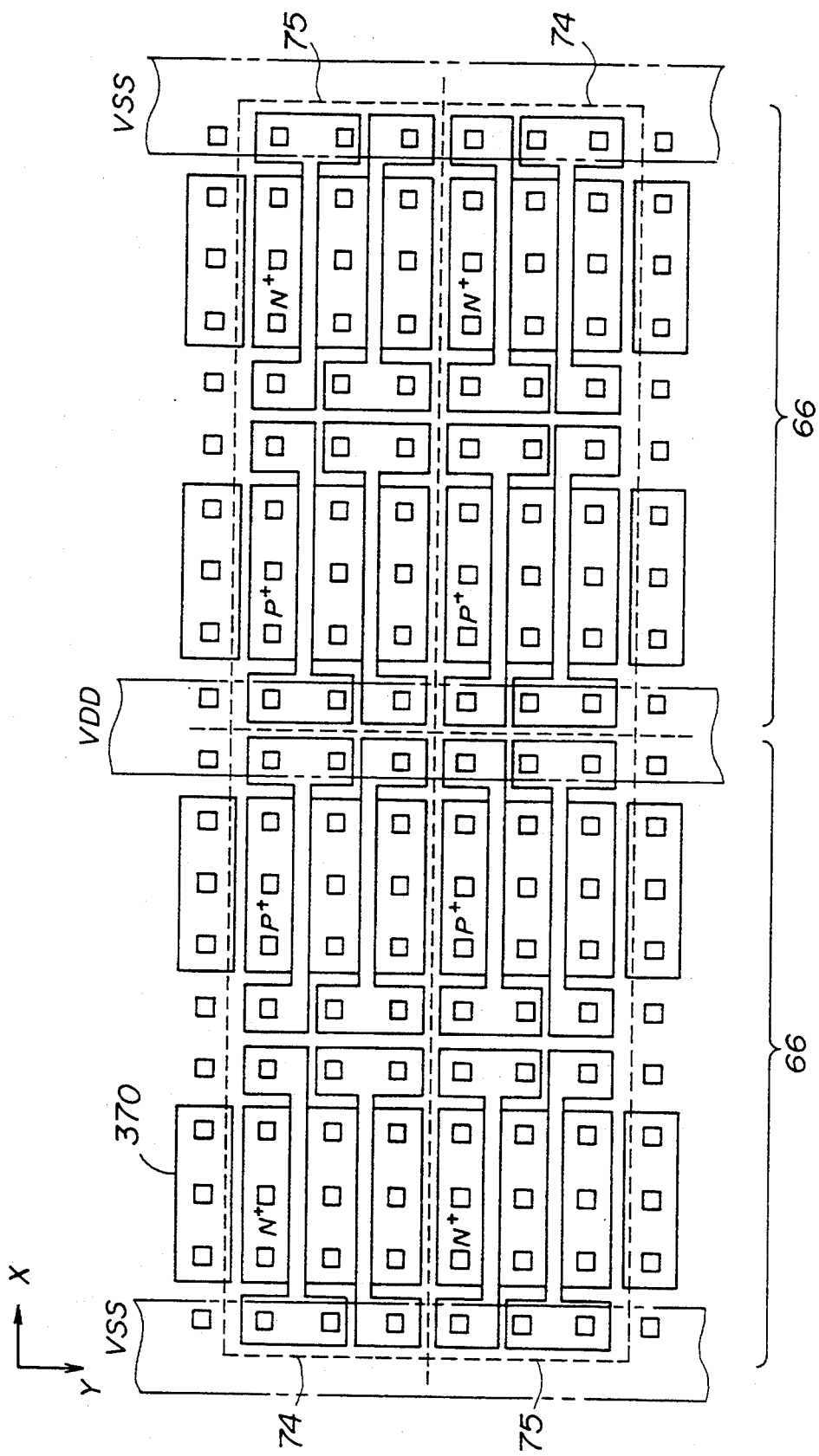
FIGS. 29A, 29B, 29C and 29D are plan views of variations of the first embodiment of the present invention.

FIG. 29A shows a first relationship between the conductivity type of each CMOS transistor area and the arrangement of the power supply lines. The basic cell 66 in the left-hand column shown in FIG. 29A has the N+-type diffused area and the P+-type diffused area from the left to right of the left-hand column in the X direction. The basic cell 66 in the right-hand column shown in FIG. 29A has the P+-type diffused area and the N+-type diffused area from the left to right of the right-hand column in the X direction. That is, the P+-type diffused area of the basic cell 66 in the left-hand column faces the P+-type diffused area of the basic cell 66 in the right-hand column. The supply lines extend in the Y direction. A reference numeral 370 indicates a substrate contact area.

Figure 29B:
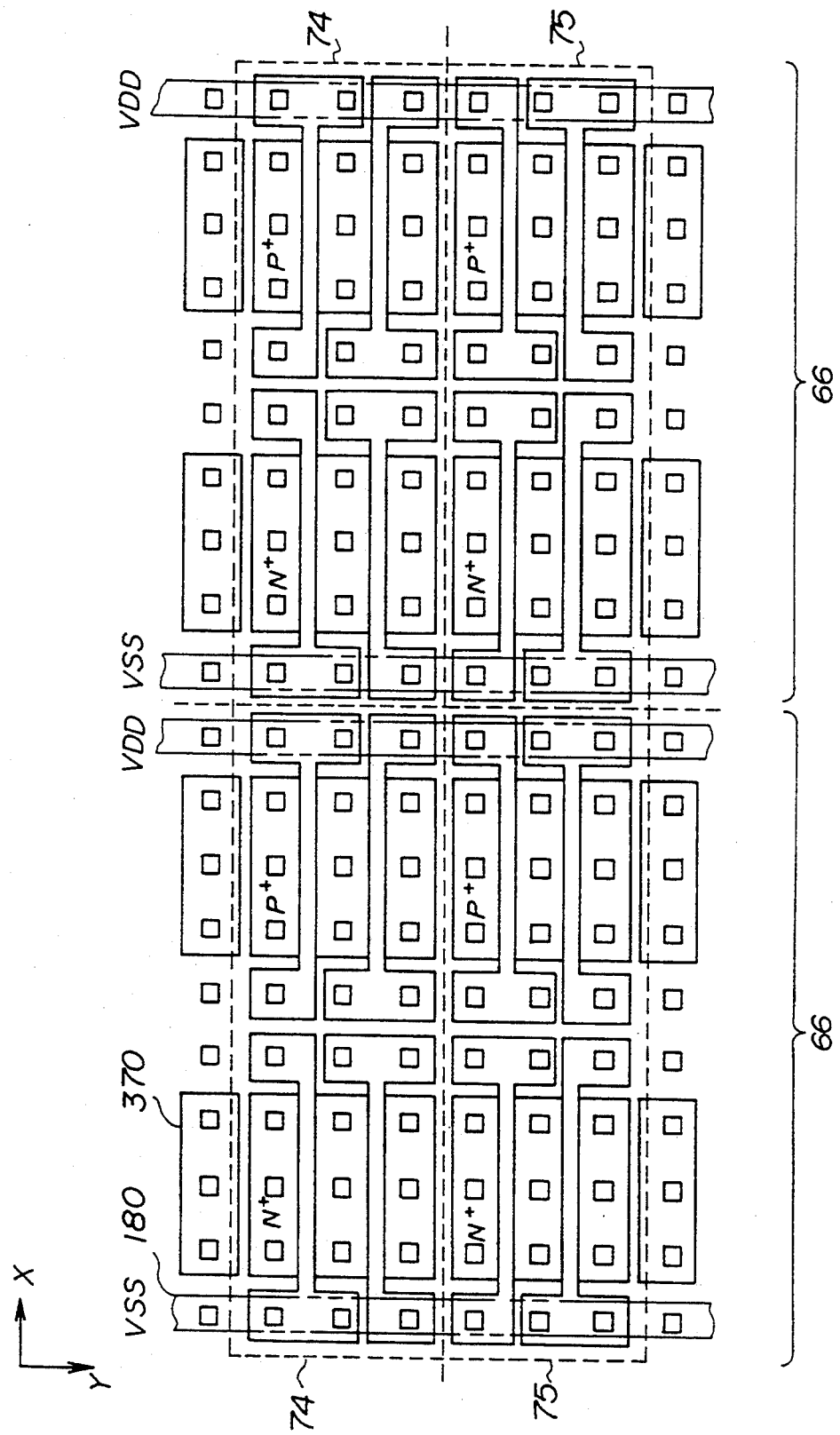

FIG. 29B shows a second relationship between the conductivity type of each CMOS transistor area and the arrangement of the power supply lines. The basic cell 66 in the left-hand column shown in FIG. 29B has the N+-type diffused area and the P+-type diffused area from the left to right of the left-hand column in the X direction. The basic cell 66 in the right-hand column shown in FIG. 29B has the N+-type diffused area and the P+-type diffused area from the left to right of the right-hand column in the X direction. That is, the P+-type diffused area of the basic cell 66 in the left-hand column faces the N+-type diffused area of the basic cell 66 in the right-hand column. The power supply lines extend in the Y direction.

Figure 29C:
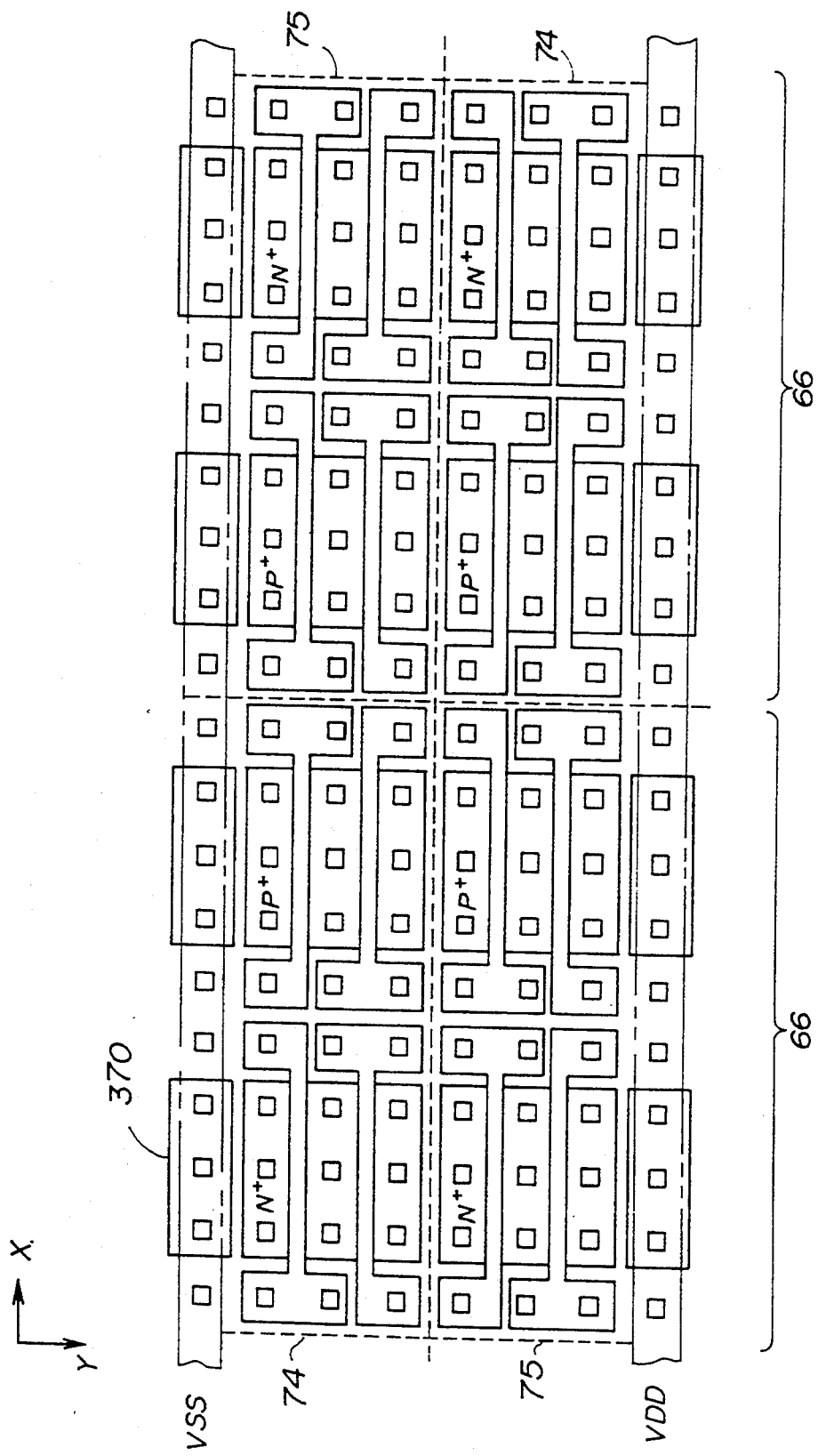

FIG. 29C shows a third relationship between the conductivity type of each CMOS transistor area and the arrangement of the power supply lines. The basic cell 66 in the left-hand column shown in FIG. 29C has the N+-type diffused area and the P+-type diffused area from the left to right of the left-hand column in the X direction. The basic cell 66 in the right-hand column shown in FIG. 29C has the P+-type diffused area and the N+-type diffused area from the left to right of the right-hand column in the X direction. That is, the P+-type diffused area of the basic cell 66 in the left-hand column faces the P+-type diffused area of the basic cell 66 in the right-hand column. The power supply lines extend in the X direction. The width of each power supply line shown in FIG. 29A is greater than that of each power supply line shown in FIG. 29C. Hence, the power supply lines shown in FIG. 29A have a large mechanical strength and a large breakdown voltage, as compared with those shown in FIG. 29C.

Figure 29D:
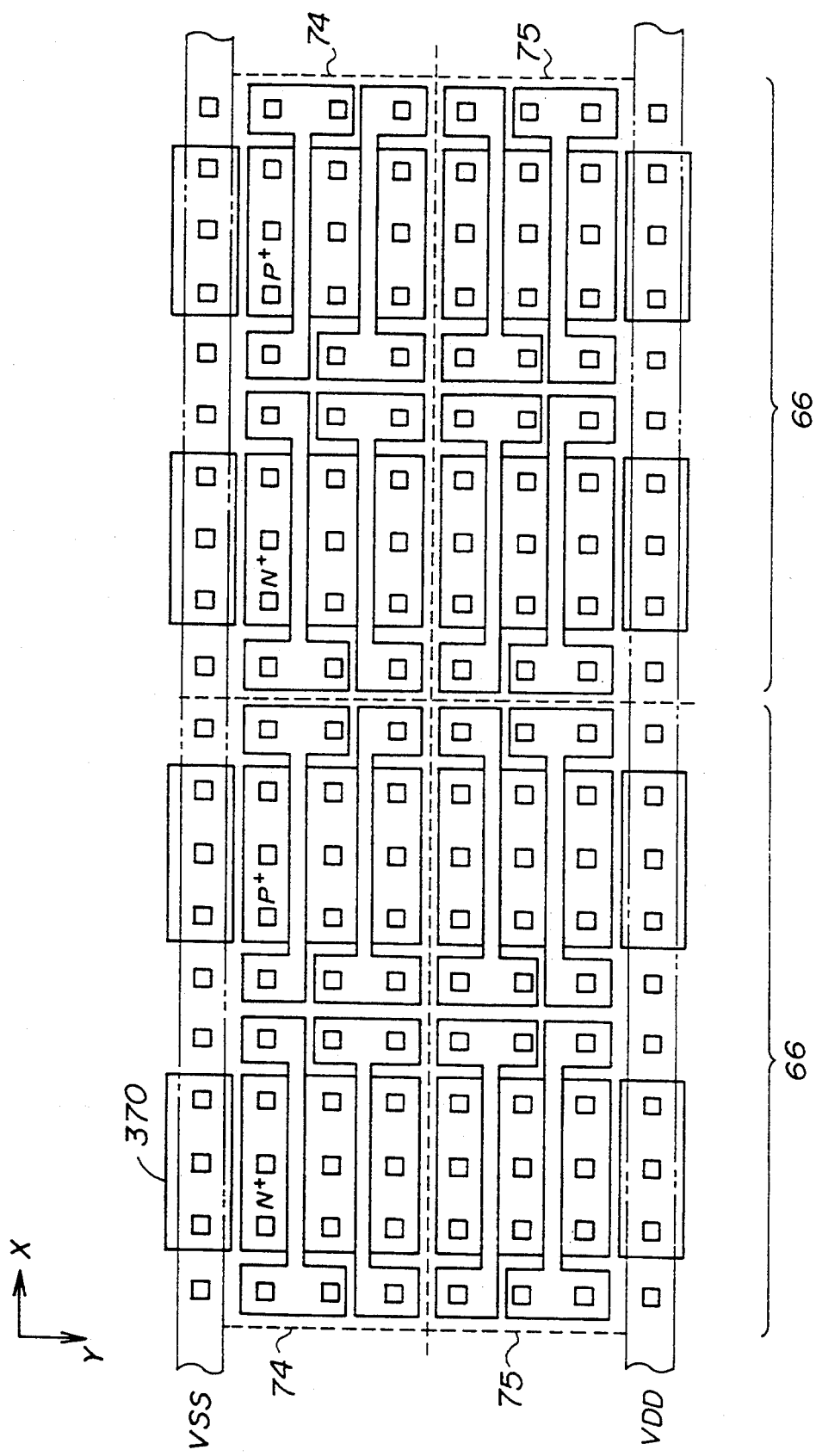

FIG. 29D shows a fourth relationship between the conductivity type of each CMOS transistor area and the arrangement of the power supply lines. The basic cell 66 in the left-hand column shown in FIG. 29D has the N+-type diffused area and the P+-type diffused area from the left to right of the left-hand column in the X direction. The basic cell 66 in the right-hand column shown in FIG. 29B has the N+-type diffused area and the P+-type diffused area from the left to right of the right-hand column in the X direction. That is, the P+-type diffused area of the basic cell 66 in the left-hand column faces the N+-type diffused area of the basic cell 66 in the right-hand column. The power supply lines extend in the X direction.

It is possible to selectively employ the above first to fourth relationships depending on practical applications of the basic cells.

Figure 30:
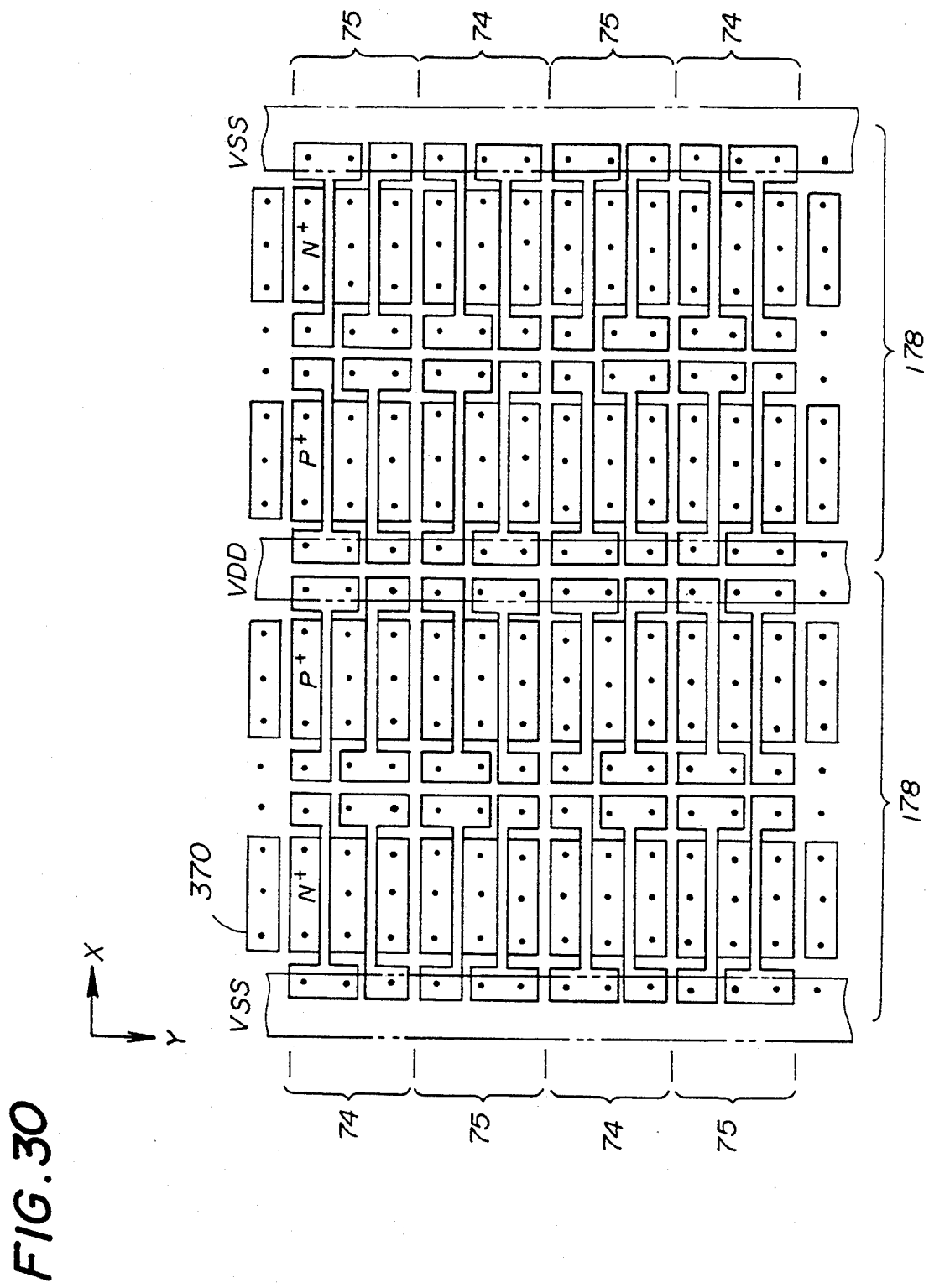
FIG. 30 is a plan view of a second embodiment of the present invention.

FIG. 30 shows a part of a basic cell area according to a second embodiment of the present invention. A basic cell 178 shown in FIG. 30 comprises CMOS transistor areas 74, 75, 74 and 75 arranged side by side in the Y direction. The P+-type diffused region of the left-hand column faces the P+-type diffused region of the right-hand column. It is also possible to design the conductivity of each diffused region in the same manner as shown in FIG. 29B. The power supply lines VSS and VDD extend in the Y direction.

Figure 31:
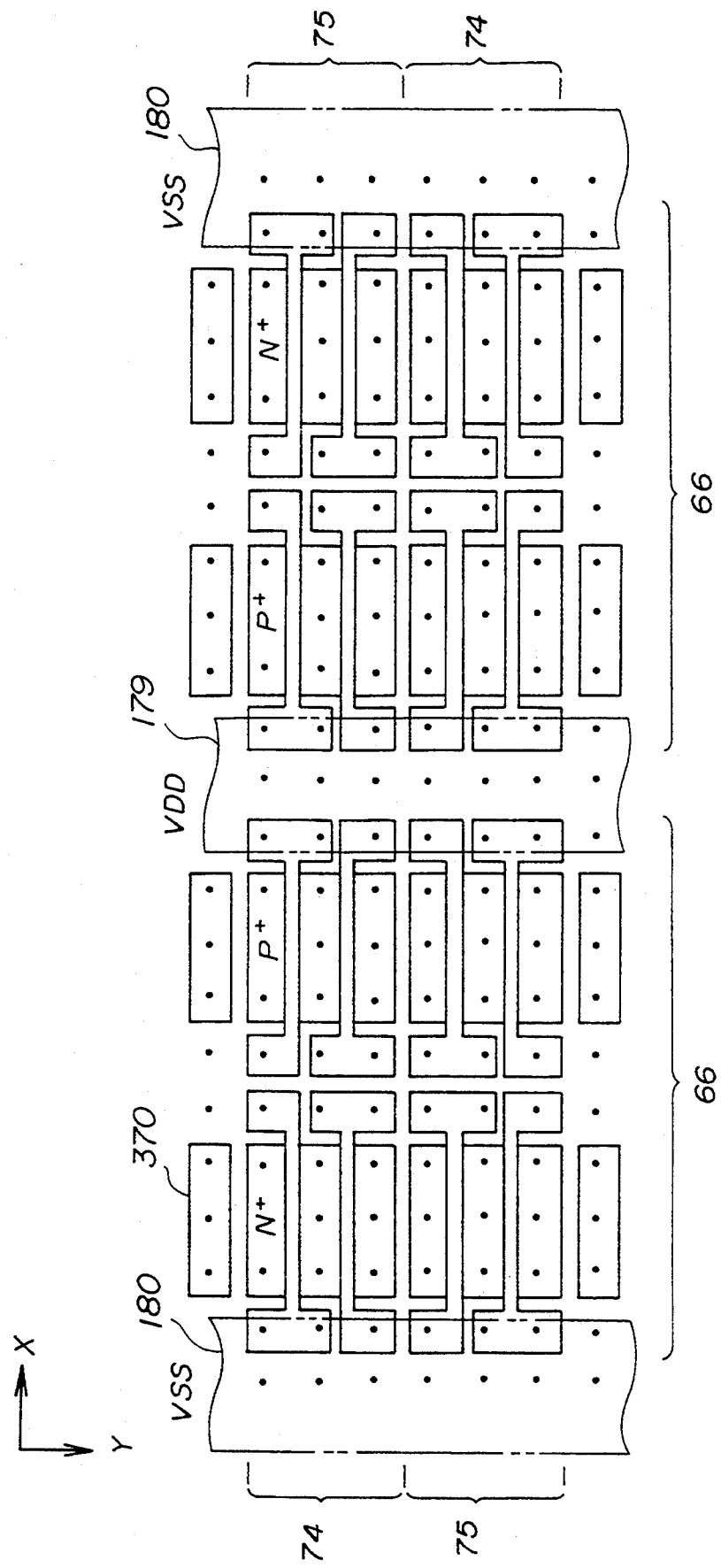
FIG. 31 is a plan view of a third embodiment of the present invention.

FIG. 31 shows a part of a basic cell area according to a third embodiment of the present invention. The third embodiment of the present invention corresponds to a variation of the arrangement shown in FIG. 31. The CMOS transistor areas shown in FIG. 31 are arranged at increased intervals between adjacent CMOS transistor areas in the X direction. In FIG. 31, the adjacent CMOS transistor areas are separated from each other in the X direction with a pitch equal to two wiring lines. Power supply lines 179 and 180 extend in the X direction and widths larger than those of the power supply lines shown in FIG. 29A. Hence, the power supply lines 179 and 180 shown in FIG. 31 have a large mechanical strength and a large breakdown voltage, as compared with those shown in FIG. 29A.

Figure 32:
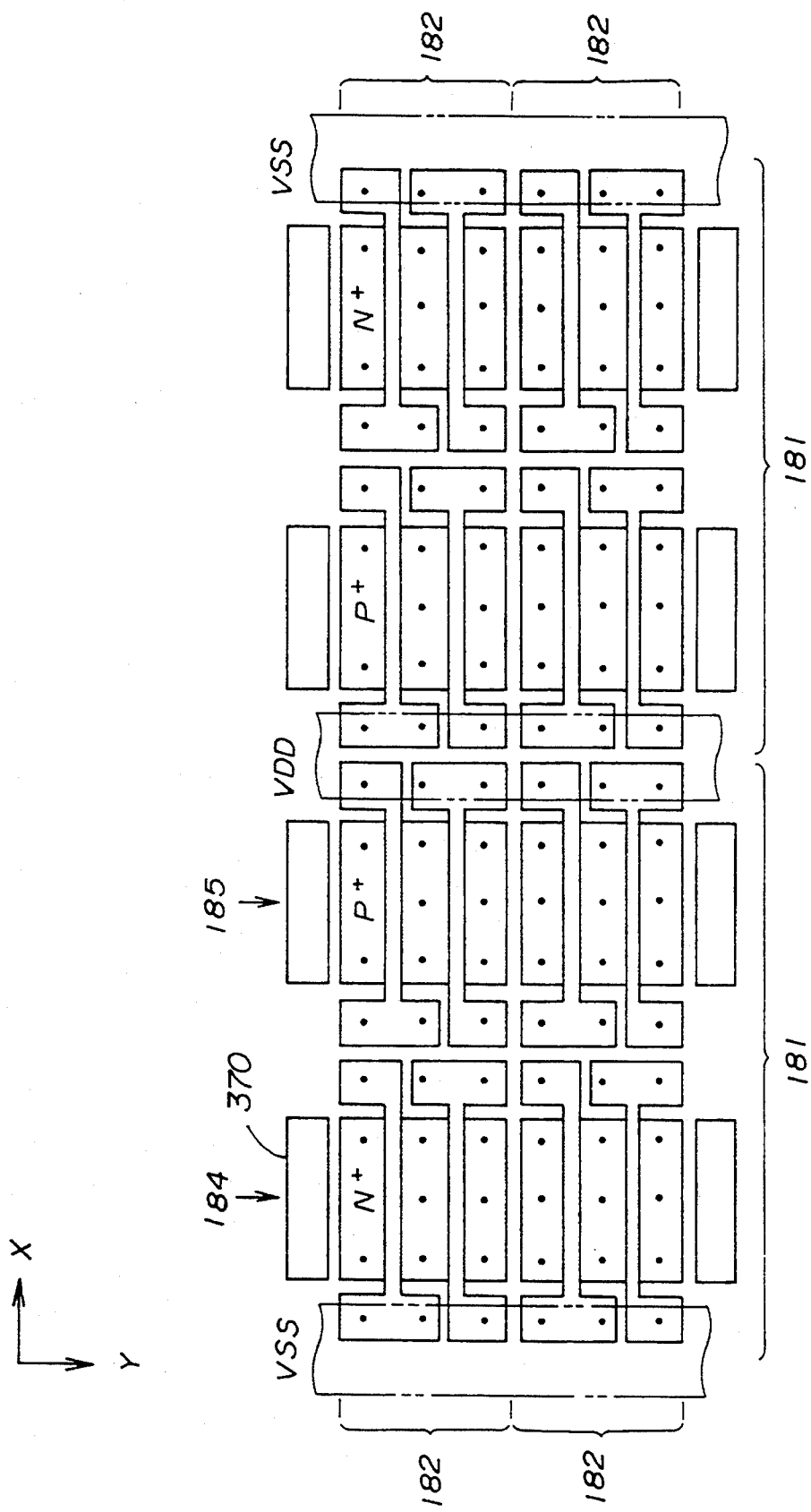
FIG. 32 is a plan view of a fourth embodiment of the present invention.

FIG. 32 shows a part of a basic cell area according to a fourth embodiment of the present invention. Referring to FIG. 32, there are illustrated two basic cells 181, each of which comprises two CMOS transistor areas 182 arranged side by side in the X direction. Each of the two CMOS transistor areas in each of the basic cells 181 comprises an nMOS transistor area 184 and a pMOS transistor area 185 arranged side by side in the X direction. The pMOS transistor area 185 is obtained by rotating the pMOS transistor area 80 shown in FIG. 10 by 180° about the Y axis. The basic cell 181 on the right side has the same pattern as the basic cell 181 on the left side. The pMOS transistor area 185 of the left-hand basic cell 181 faces the pMOS transistor area 185 of the right-hand basic cell 181. It is also possible to arrange the transistor areas so that the transistor areas having different conductivity face each other.

Figure 33:
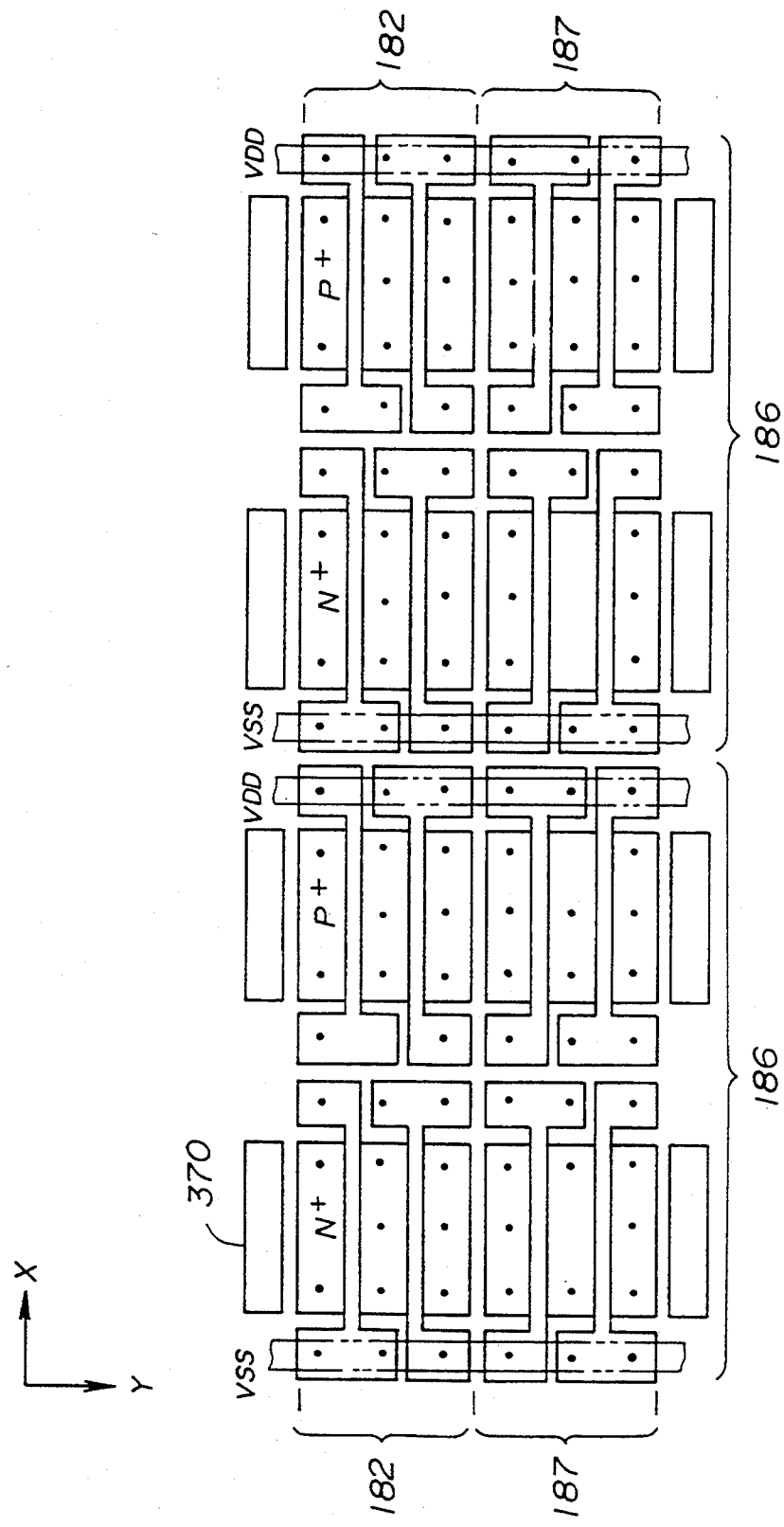
FIG. 33 is a plan view of a fifth embodiment of the present invention.

FIG. 33 is a plan view of a part of a basic cell area according to a fifth embodiment of the present invention. Referring to FIG. 33, there are illustrated two basic cells 186. Each of the basic cells 186 comprises a CMOS transistor area 182 and a CMOS transistor area 187. The CMOS transistor area 182 is obtained by rotating the CMOS transistor area 182 by 180° about the X axis. The basic cells 186 are arranged side by side in the X direction so that the pMOS transistor areas of the left-hand basic cell 186 faces the nMOS transistor areas of the right-hand basic cell 186. It is also possible to modify the arrangement shown in FIG. 33 so that the transistor areas having the same conductivity face each other.

Figure 34A:
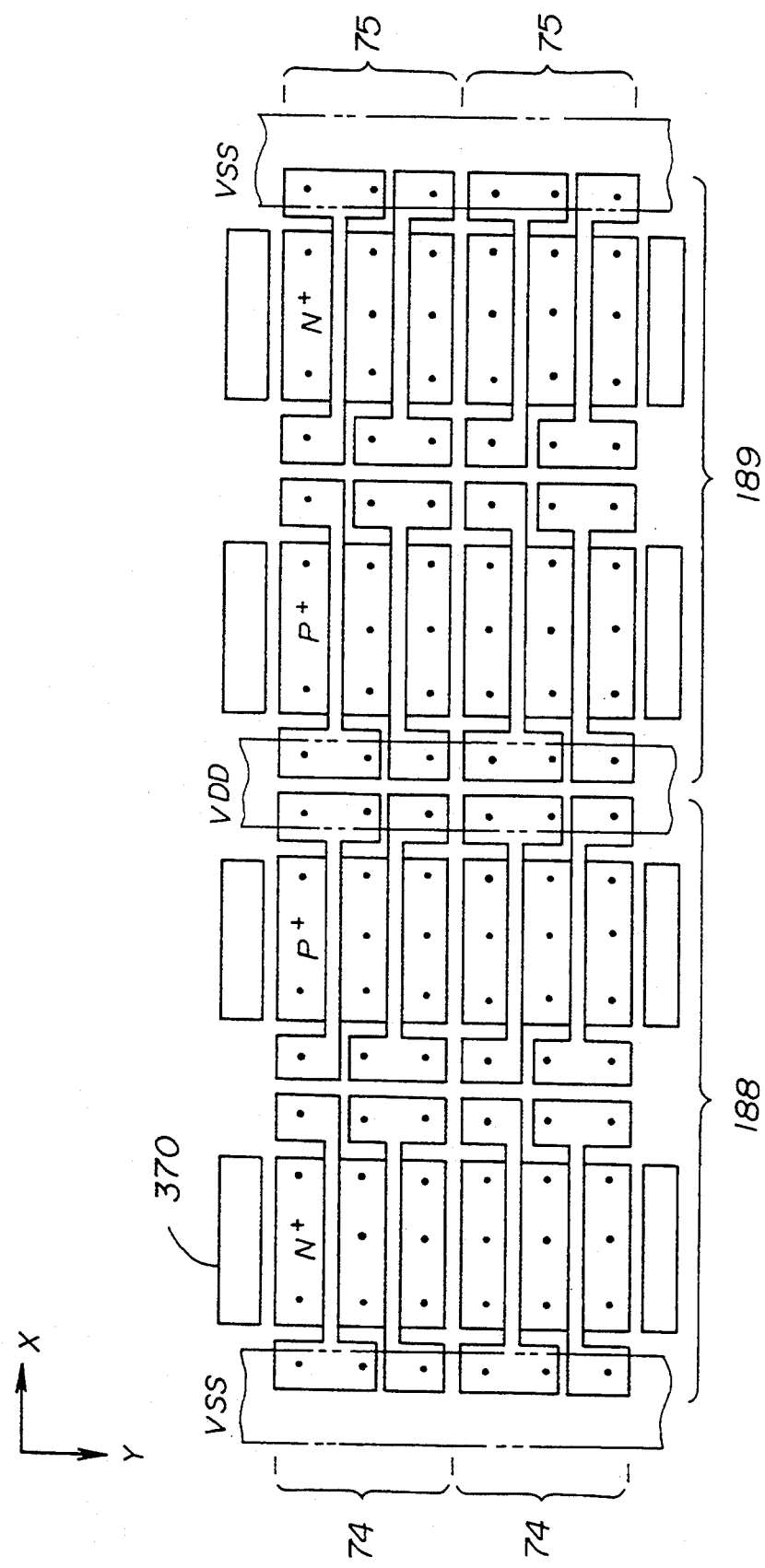

FIG. 34A shows a part of a basic cell area according to a sixth embodiment of the present invention. Two basic cells 188 and 189 are illustrated in FIG. 34A. The basic cell 188 comprises two CMOS transistor areas 74 arranged side by side in the Y direction. The basic cell 189 comprises two CMOS transistor areas 75 arranged side by side in the Y direction. The pMOS transistor areas of the basic cell 188 face the pMOS transistor areas of the basic cell 189. The power supply lines extend in the Y direction.

Figure 34B:
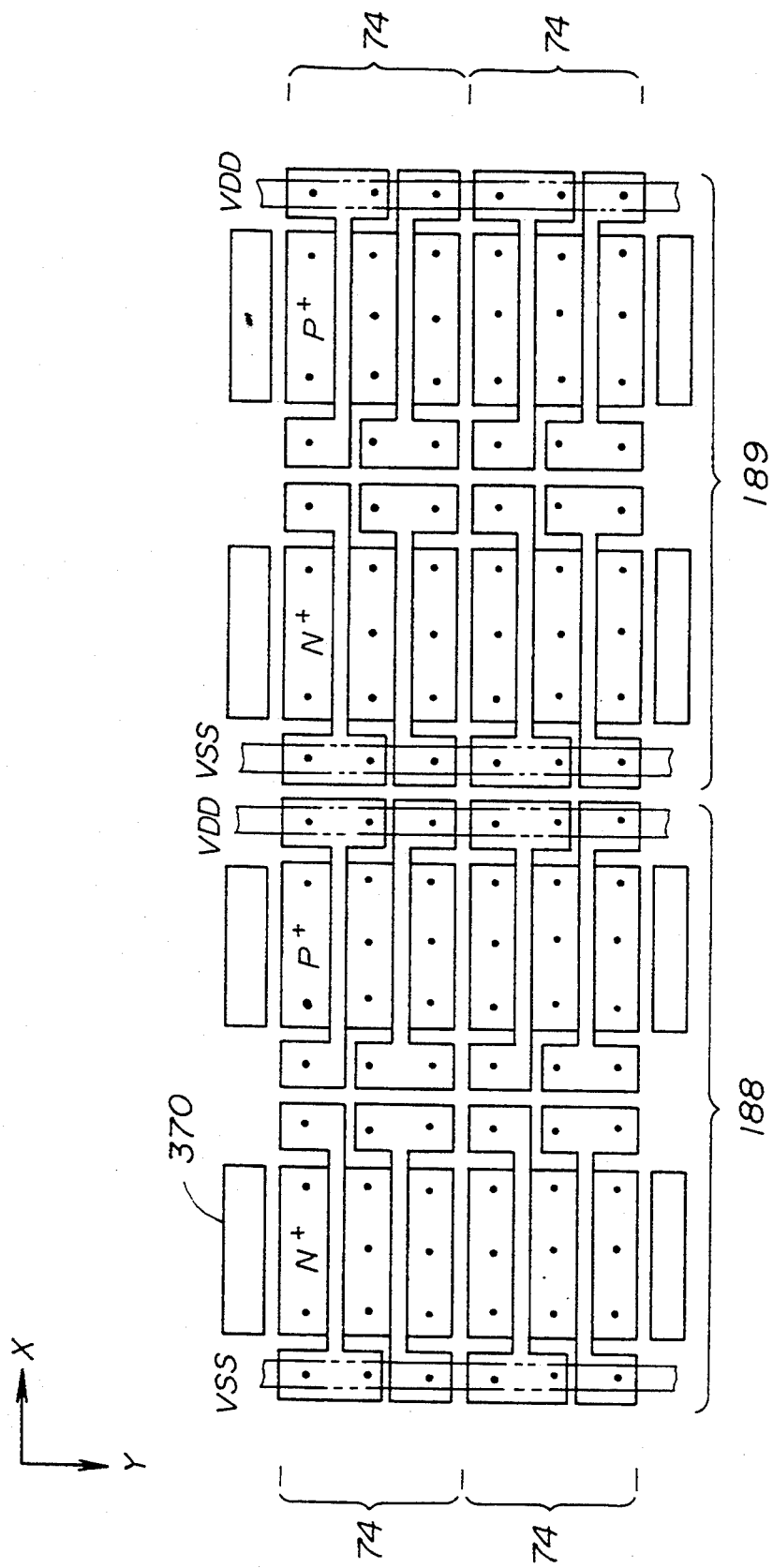

FIG. 34B shows a first variation of the basic cell area shown in FIG. 34A. The first variation shown in FIG. 34B has the same pattern arrangement of gate electrodes in the basic cells 188 and 189 as the sixth embodiment shown in FIG. 34A. However, the first variation is different from the first embodiment shown in FIG. 34A in that the pMOS transistor areas of the basic cell 188 face the nMOS transistor areas of the basic cell 189.

Figure 34C:
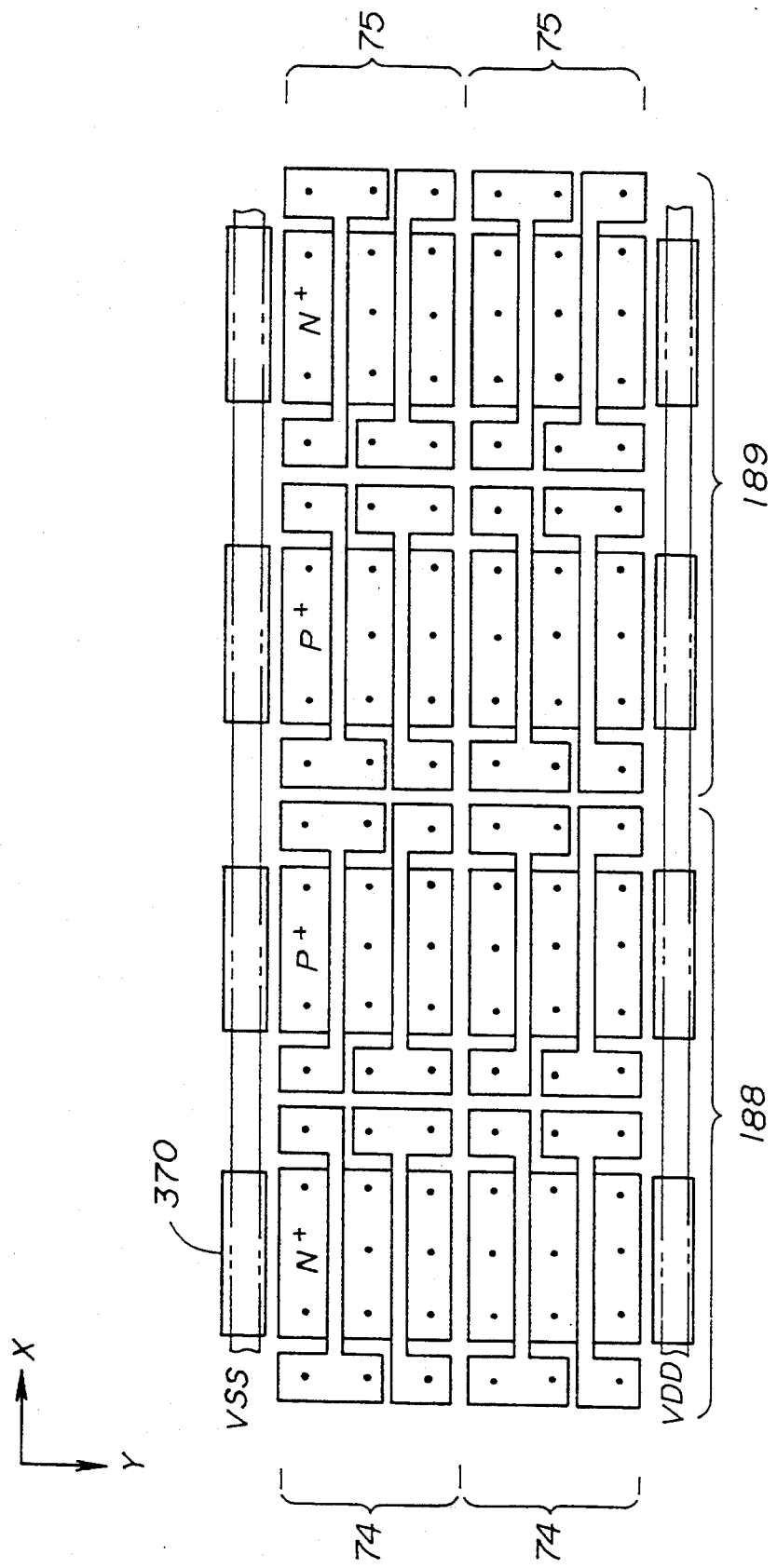

FIG. 34C shows a second variation of the basic cell area shown in FIG. 34B. The gate electrodes in the basic cells 188 and 189 shown in FIG. 34C are arranged in the same manner as those of the first embodiment shown in FIG. 34A. The power supply lines VSS and VDD shown in FIG. 34C extend in the X direction.

FIG. 34D shows a third variation of the basic cell area shown in FIG. 34D. The gate electrodes in the basic cells 188 and 189 shown in FIG. 34D are arranged in the same manner as those in the basic cells 188 and 189 shown in FIG. 34B. The power supply lines VSS and VDD extend in the X direction.

Figure 35:
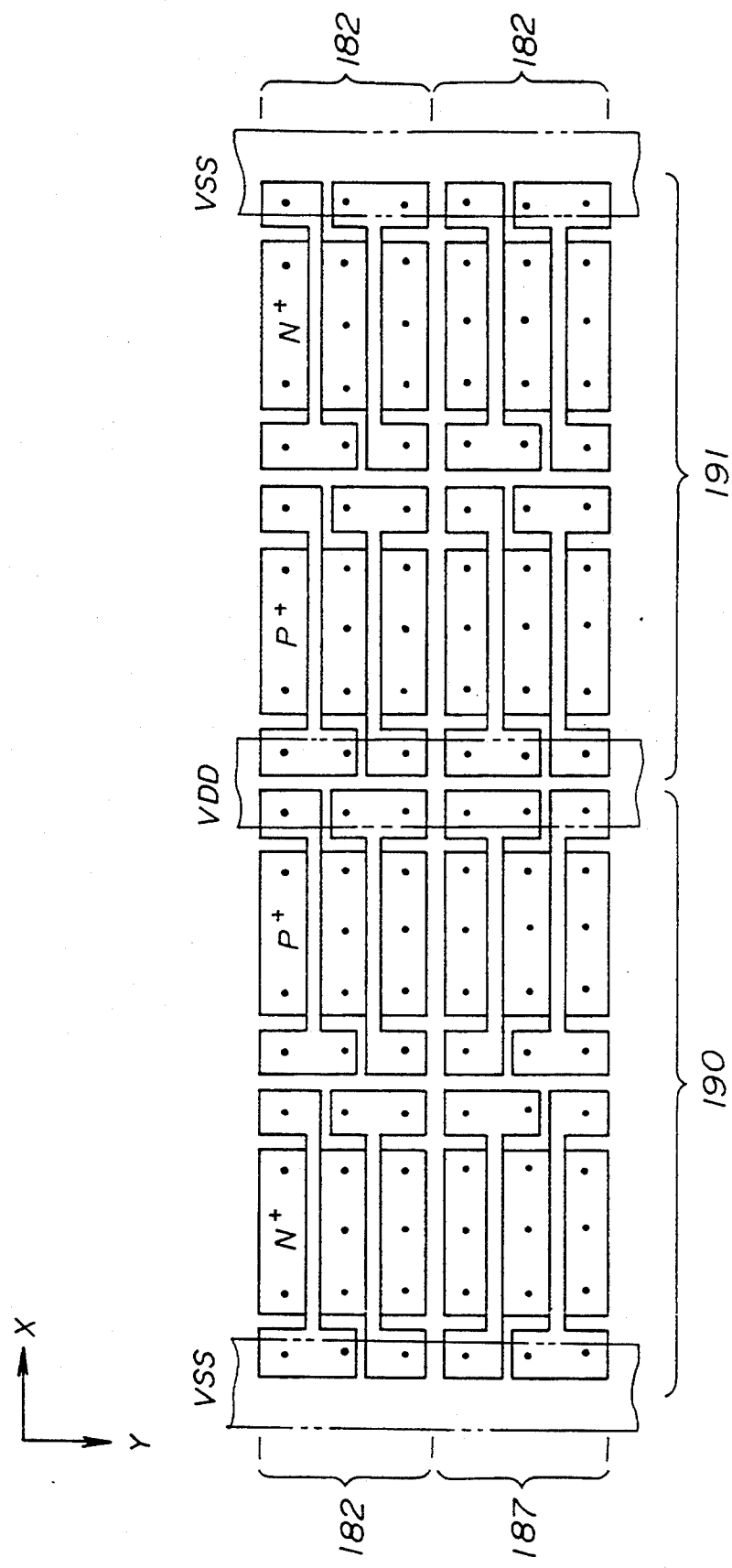
FIG. 35 is a plan view of a seventh embodiment of the present invention.

FIG. 35 shows a part of a basic cell area according to a seventh embodiment of the present invention. There are two basic cells 190 and 191 in FIG. 35. The basic cell 190 comprises a CMOS transistor area 182 and a CMOS transistor area 187, in which a mirror relationship is obtained with respect to the X axis. The basic cell 191 comprises two identical CMOS transistor areas 182. The power supply lines extend in the X direction.

It will be noted that a larger number of variations and modifications other than the specifically described arrangements can be obtained using the transistor pattern shown in FIG. 3.

Figure 36:
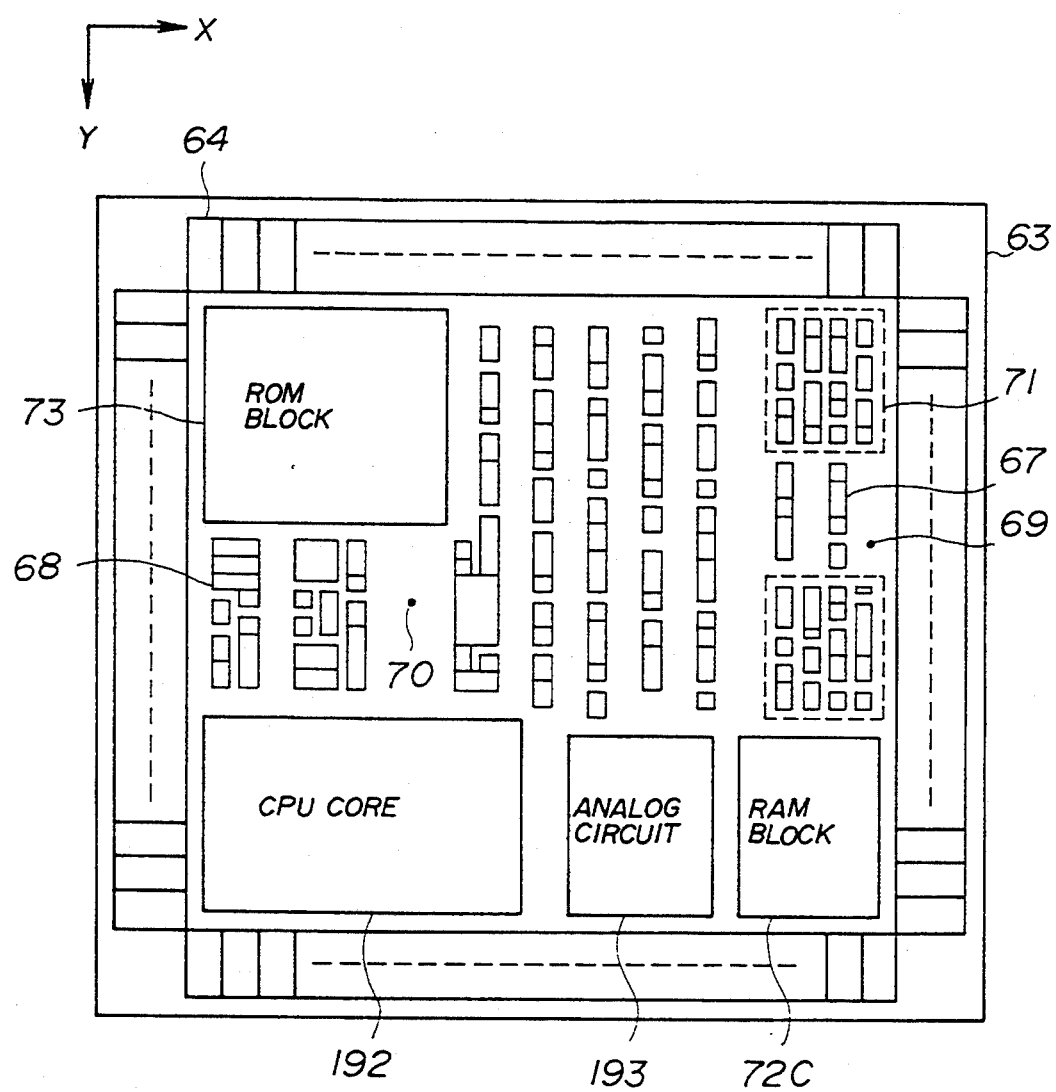
FIG. 36 is a plan view of a hybrid LSI using the basic cells of the present invention.

The present invention can be applied to a hybrid LSI shown in FIG. 36, which has a CPU core 192 configured without basic cells, and an analog circuit configured without basic cells.

The present invention is not limited to the specifically disclosed embodiments, and variations and modifications may be made without departing from the scope of the present invention.

What is claimed is:

1. A master-slice type semiconductor integrated circuit device comprising:
   a first transistor; and
   a second transistor;
   the first and second transistors being arranged side by side in a first direction;
   said first and second transistors respectively having first and second gate electrodes extending in a second direction perpendicular to the first direction;
   said first gate electrode having a first portion which has sufficient space thereon to form two gate contacts in the first direction; and
   said second gate electrode having a second portion which is adapted to have formed thereon two gate contacts in the first direction; said first portion of said first gate electrode and said second portion of said second gate electrode being respectively located at end portions of said first gate electrode and said second gate electrode, and are located at different sides of said first gate electrode and said second gate electrode.

2. A master-slice type semiconductor integrated circuit device comprising:
   a first transistor; and
   a second transistor;
   the first and second transistors being arranged side by side in a first direction;
   said first and second transistors respectively having first and second gate electrodes extending in a second direction perpendicular to the first direction;

said first gate electrode having a first portion which has sufficient space thereon to form two gate contacts in the first direction; and said second gate electrode having a second portion which is adapted to have formed thereon two gate contacts in the first direction;

wherein said sufficient space to form the two gate contacts in the first portion of said first gate electrode is located under a second wiring channel which extends in the first direction and which is spaced apart from said first wiring channel in the second direction.

3. A master-slice type semiconductor integrated circuit device as claimed in claim 1, wherein:

said first gate electrode comprises a third portion in which one gate contact is;

said second gate electrode comprises a fourth portion in which one gate contact is made;

said first gate electrode comprises a fifth portion connecting the first and third portions to each other; and said second gate electrode comprises a sixth portion connecting the second and fourth portions to each other.

4. A master-slice type semiconductor integrated circuit device as claimed in claim 3, wherein:

the two gate contacts in the first portion of said first gate electrode and said one gate contact in the fourth portion of said second gate electrode are arranged in a line in the first direction; and the two gate contacts in the second portion of the second gate electrode and said one gate contact in the third portion of said first gate electrode are arranged in a line in the first direction.

5. A master-slice type semiconductor integrated circuit device as claimed in claim 3, wherein:

one of the two gate contacts in the first portion of said first gate electrode and one of the two gate contacts in the second portion of said second gate electrode are located under a wiring channel extending in the second direction.

6. A master-slice type semiconductor integrated circuit device as claimed in claim 3, wherein:

the fifth portion of said first gate electrode has a first curved portion connected to the third portion thereof; and the sixth portion of said second gate electrode has a first curved portion connected to the fourth portion thereof.

7. A master-slice type semiconductor integrated circuit device as claimed in claim 1, wherein:

said first transistor comprises first and second impurity diffused regions arranged side by side in the first direction;

said second transistor comprises the second impurity diffused region and a third impurity diffused regions arranged side by side in the first direction; and said first, second and third impurity diffused regions have identical conductivity.

8. A master-slice type semiconductor integrated circuit device as claimed in claim 7, wherein:

each of said first, second and third impurity diffused regions have identical widths in the second direction; and the identical widths respectively accommodate three wiring channels extending in the first direction.

9. A master-slice type semiconductor integrated circuit device comprising:

a first transistor arrangement; and a second transistor arrangement;

said first and second transistor arrangements having first and second conductivities;

wherein each of said first and second transistor arrangements comprises:

a first transistor; and a second transistor;

said first and second transistors being arranged side by side in a first direction;

said first and second transistor respectively having first and second gate electrodes extending in a second direction perpendicular to the first direction;

said first and second transistor arrangements being arranged side by side in the second direction;

said first gate electrode having a first portion which has sufficient space thereon to form two gate contacts in the first direction; and said second gate electrode having a second portion which is adapted to have formed thereon two gate contacts in the first direction; said first portion of said first gate electrode and said second portion of said second gate electrode being respectively located at end portions of said first gate electrode and said second gate electrode, and are located at different sides of said first gate electrode and said second gate electrode.

10. A master-slice type semiconductor integrated circuit device as claimed in claim 9, wherein the first and second gate electrodes in the first transistor arrangement are symmetrical with the first and second gate electrodes in the second transistor arrangement with respect to an imaginary boundary line which is located between the first and second transistor arrangements and extends in the first direction.

11. A master-slice type semiconductor integrated circuit device as claimed in claim 9, wherein the first and second gate electrodes in the first transistor arrangement are disposed in a manner identical to the first and second gate electrodes in the second transistor arrangement.

12. A master-slice type semiconductor integrated circuit device as claimed in claim 9, further comprising:

a first power supply channel extending in the first direction above the first portion of said first gate electrode; and a second power supply channel extending in the second direction above the second portion of said second gate electrode.

13. A master-slice type semiconductor integrated circuit device as claimed in claim 9, further comprising:

a first power supply channel extending in the second direction on first sides of said first and second transistor arrangements; and a second power supply channel extending in the second direction on second sides of said first and second transistor arrangements.

14. A master-slice type semiconductor integrated circuit device as claimed in claim 13, further comprising a first group of substrate contact areas arranged in a line in the second direction along the first sides of said first and second transistor arrangements; and a second group of substrate contact areas arranged in a line in the second direction along the second sides of said first and second transistor arrangements.

15. A master-slice type semiconductor integrated circuit device comprising:
- a first transistor arrangement;
- a second transistor arrangement;
- a third transistor arrangement; and
- a fourth transistor arrangement;
- said first and second transistor arrangements having first and second conductivities, respectively;
- said third and fourth transistor arrangements having the first and second conductivities, respectively;
- each of said first, second, third and fourth transistor arrangements comprising:
- a first transistor; and
- a second transistor;
- said first and second transistors being arranged side by side in a first direction in which the first and third transistor arrangements are arranged side by side and second and fourth transistor arrangements are arranged side by side;
- said first and second transistors respectively having first and second gate electrodes extending in a second direction perpendicular to the first direction;
- said first and second transistor arrangements being arranged side by side in the second direction and said third and fourth transistor arrangements being arranged side by side in the second direction;
- said first gate electrode having a first portion which is adapted to have formed thereon two gate contacts in the first direction; and
- said second gate electrode having a second portion which is adapted to have formed thereon two gate contacts in the first direction; said first portion of said first gate electrode and said second portion of said second gate electrode being respectively located at end portions of said first gate electrode and said second gate electrode, and are located at different sides of said first gate electrode and said second gate electrode.

16. A master-slice type semiconductor integrated circuit device as claimed in claim 15, wherein:
- said first and second gate electrodes in the first transistor arrangement are symmetrical with the first and second electrodes in the second transistor arrangement with respect to a first imaginary boundary line located between the first and second transistor arrangements and extending in the first direction; and
- said first and second gate electrodes in the third transistor arrangement are symmetrical with the first and second electrodes in the fourth transistor arrangement with respect to said first imaginary boundary line.

17. A master-slice type semiconductor integrated circuit device as claimed in claim 16, wherein:
- said first and second electrodes in the first transistor arrangement are symmetrical with the first and second electrodes in the third transistor arrangement with respect to a second boundary line located between the first and third transistor arrangements and extending in the second direction; and
- said first and second electrodes in the second transistor arrangement are symmetrical with the first and second electrodes in the fourth transistor arrangement with respect to a third boundary line located between the second and fourth transistor arrangements and extending in the second direction.

18. A master-slice type semiconductor integrated circuit device as claimed in claim 17, further comprising:
- a first power supply channel extending in the first direction; and
- a second power supply channel extending in the first direction;
- said first and second power supply channels being spaced apart from each other and located outside impurity diffused regions formed in said first, second, third and fourth transistor arrangements.

19. A master-slice type semiconductor integrated circuit device as claimed in claim 17, further comprising:
- a first power supply channel extending in the second direction; and
- a second power supply channel extending in the second direction,
- said first and second power supply channels being spaced apart from each other and located outside impurity diffused regions formed in said first, second, third and fourth transistor arrangements.

20. A master-slice type semiconductor integrated circuit device as claimed in claim 15, wherein:
- the first and second gate electrodes in the first transistor arrangement are disposed in a manner identical to the first and second gate electrodes in the second transistor arrangement; and
- the first and second gate electrodes in the third transistor arrangement are disposed in a manner identical to the first and second gate electrodes in the fourth transistor arrangement.

21. A master-slice type semiconductor integrated circuit device as claimed in claim 15, wherein:
- the first and second gate electrodes in the first transistor arrangement are disposed in a manner identical to the first and second gate electrodes in the third transistor arrangement; and
- the first and second gate electrodes in the second transistor arrangement are disposed in a manner identical to the first and second gate electrodes in the fourth transistor arrangement.

22. A master-slice type semiconductor integrated circuit device comprising:
- a first basic cell; and
- a second basic cell;
- each of the first and second basic cells comprising:
- a first transistor arrangement;
- a second transistor arrangement;
- a third transistor arrangement;
- a fourth transistor arrangement;
- said first and second transistor arrangements in each of the first and second basic cells having the first and second conductivities, respectively;
- each of said first, second, third and fourth transistor arrangements in each of the first and second basic cells comprising:
- a first transistor; and
- a second transistor;
- said first and second transistors being arranged side by side in a first direction in which the first and third transistor arrangements are arranged side by side and second and fourth transistor arrangements are arranged side by side and said first and second basic cells are arranged side by side;
- said first and second transistors respectively having first and second gate electrodes extending in a second direction perpendicular to the first direction;

said first and second transistor arrangements being arranged side by side in the second direction and said third and fourth transistor arrangements being arranged side by side in the second direction;

said first gate electrode having a first portion which is adapted to have formed thereon two gate contacts in the first direction; and said second gate electrode having a second portion which is adapted to have formed thereon two gate contacts in the first direction; said first portion of said first gate electrode and said second portion of said second gate electrode being respectively located at end portions of said first gate electrode and said second gate electrode, and are located at different sides of said first gate electrode and said second gate electrode.

23. A master-slice type semiconductor integrated circuit device as claimed in claim 22, wherein in each of the first and second basic cells:

said first and second gate electrodes in the first transistor arrangement are symmetrical with the first and second electrodes in the second transistor arrangement with respect to a first imaginary boundary line located between the first and second transistor arrangements and extending in the first direction; and said first and second gate electrodes in the third transistor arrangement are symmetrical with the first and second electrodes in the fourth transistor arrangement with respect to said first imaginary boundary line, and wherein said first and second basic cells are symmetrical with each other with respect to a second imaginary boundary line located between the first and second basic cells and extending in the first direction.

24. A master-slice type semiconductor integrated circuit device as claimed in claim 23, further comprising:

a first power supply channel extending in the first direction along a first end of the first basic cell;

a second power supply channel extending in the first direction along a second end of the first basic cell and a first end of the second basic cell; and a third power supply channel extending in the first direction along a second end of the second basic cell.

25. A master-slice type semiconductor integrated circuit device as claimed in claim 24, wherein:

the second and fourth transistor arrangements of said first basic cell face the first and third transistor arrangements of said second basic cell in the second direction; and the second and fourth transistor arrangements of said first basic cell and the first and third transistor arrangements of said second basic cell have identical conductivities.

26. A master-slice type semiconductor integrated circuit device as claimed in claim 23, further comprising:

a first power supply channel extending in the first direction along a first end of the first basic cell;

a second power supply channel extending in the first direction along a second end of the first basic cell;

a third power supply channel extending in the first direction along a first end of the second basic cell; and a fourth power supply channel extending in the first direction along a second end of the second basic cell.

27. A master-slice type semiconductor integrated circuit device as claimed in claim 26, wherein:

the second and fourth transistor arrangements of said first basic cell face the first and third transistor arrangements of said second basic cell in the second direction;

the second and fourth transistor arrangements of said first basic cell have a first conductivity; and the first and third transistor arrangements of said second basic cell have a second conductivity different from the first conductivity.

28. A master-slice type semiconductor integrated circuit device as claimed in claim 23, further comprising:

a first power supply channel extending in the second direction; and a second power supply channel extending in the second direction, said first and second basic cells being interposed between said first and second power supply channels.

29. A master-slice type semiconductor integrated circuit device as claimed in claim 28, wherein:

the second and fourth transistor arrangements of said first basic cell face the first and third transistor arrangements of said second basic cell in the second direction; and the second and fourth transistor arrangements of said first basic cell and the first and third transistor arrangements of said second basic cell have identical conductivities.

30. A master-slice type semiconductor integrated circuit device as claimed in claim 28, wherein:

the second and fourth transistor arrangements of said first basic cell face the first and third transistor arrangements of said second basic cell in the second direction;

the second and fourth transistor arrangements of said first basic cell have a first conductivity; and the first and third transistor arrangements of said second basic cell have a second conductivity different from the first conductivity.

31. A master-slice type semiconductor integrated circuit device as claimed in claim 22, wherein in each of the first and second basic cells:

said first and second gate electrodes in the first transistor arrangement are symmetrical with the first and second electrodes in the third transistor arrangement with respect to a third imaginary boundary line located between the first and third transistor arrangements and extends in the first direction; and said first and second gate electrodes in the second transistor arrangement are symmetrical with the first and second electrodes in the fourth transistor arrangement with respect to a fourth imaginary boundary line located between the second and fourth transistor arrangements and extending in the first direction.

32. A master-slice type semiconductor integrated circuit device as claimed in claim 22, wherein in each of the first and second basic cells:

the first and second gate electrodes in the first transistor arrangement are disposed in a manner identical to the first and second gate electrodes in the third transistor arrangement; and the first and second gate electrodes in the second transistor arrangement are disposed in a manner identical to the first and second gate electrodes in the fourth transistor arrangement.

* * * * *